US012575179B2

(12) United States Patent
Watanabe et al.

(10) Patent No.: US 12,575,179 B2
(45) Date of Patent: Mar. 10, 2026

(54) DISPLAY DEVICE AND METHOD FOR DRIVING DISPLAY DEVICE

(71) Applicant: SEMICONDUCTOR ENERGY LABORATORY CO., LTD., Atsugi (JP)

(72) Inventors: Kazunori Watanabe, Tokyo (JP); Kei Takahashi, Isehara (JP); Koji Kusunoki, Isehara (JP); Takahiro Fukutome, Atsugi (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 0 days.

(21) Appl. No.: 18/198,323

(22) Filed: May 17, 2023

(65) Prior Publication Data

US 2023/0290301 A1 Sep. 14, 2023

Related U.S. Application Data

(62) Division of application No. 17/052,833, filed as application No. PCT/IB2019/053801 on May 9, 2019, now Pat. No. 11,823,614.

(30) Foreign Application Priority Data

May 18, 2018 (JP) ................................. 2018-095963

(51) Int. Cl.
*G09G 3/32* (2016.01)
*G09G 3/3225* (2016.01)
(Continued)

(52) U.S. Cl.
CPC ............. *H10D 86/423* (2025.01); *G09G 3/32* (2013.01); *G09G 3/3225* (2013.01);
(Continued)

(58) Field of Classification Search
CPC ................... G09G 3/32; G09G 3/3225; G09G 2300/0426; G09G 2300/0809;
(Continued)

(56) References Cited

U.S. PATENT DOCUMENTS

| | | | |
|---|---|---|---|
| 7,358,935 B2 | 4/2008 | Yamashita et al. | |
| 7,679,589 B2 | 3/2010 | Park | |

(Continued)

FOREIGN PATENT DOCUMENTS

| | | |
|---|---|---|
| CN | 001755778 A | 4/2006 |
| CN | 101069226 A | 11/2007 |

(Continued)

OTHER PUBLICATIONS

Taiwanese Office Action (Application No. 108116299) Dated Jun. 19, 2023.

(Continued)

*Primary Examiner* — Patrick N Edouard
*Assistant Examiner* — Eboni N Giles
(74) *Attorney, Agent, or Firm* — Fish & Richardson P.C.

(57) ABSTRACT

A novel display device where a light-emitting element is turned on by a triangle wave is provided. One embodiment of the present invention is a method for driving a display device including a first pixel, a second pixel, a first wiring, a second wiring, and a third wiring. The first wiring is electrically connected to the first pixel and the second pixel. The second wiring and the third wiring are electrically connected to the first pixel and the second pixel, respectively. At a first time, the first pixel reaches the maximum luminance corresponding to first display data and the second pixel reaches the maximum luminance corresponding to second display data. The first pixel and the second pixel are
(Continued)

initialized at a second time different from the first time by input of a reset signal to the first wiring to stop light emission.

6 Claims, 17 Drawing Sheets

(51) Int. Cl.

| | |
|---|---|
| *H01L 25/075* | (2006.01) |
| *H10D 30/67* | (2025.01) |
| *H10D 86/40* | (2025.01) |
| *H10D 86/60* | (2025.01) |
| *H10H 20/857* | (2025.01) |
| *H10H 20/01* | (2025.01) |

(52) U.S. Cl.

CPC ..... *H01L 25/0753* (2013.01); *H10D 30/6734* (2025.01); *H10D 30/6755* (2025.01); *H10D 86/481* (2025.01); *H10D 86/60* (2025.01); *H10H 20/857* (2025.01); *G09G 2300/0426* (2013.01); *G09G 2300/0809* (2013.01); *G09G 2320/0238* (2013.01); *G09G 2330/021* (2013.01); *H10H 20/0364* (2025.01)

(58) Field of Classification Search

CPC ........... G09G 2320/0238; H10K 71/00; H10K 59/90; H01L 25/0753; H01L 27/1225; H01L 27/1255; H01L 29/78648; H01L 29/7869; H01L 33/62; H01L 2933/0066

See application file for complete search history.

(56) References Cited

U.S. PATENT DOCUMENTS

| | | | |
|---|---|---|---|
| 7,924,246 | B2 | 4/2011 | Hara |
| 8,289,244 | B2 | 10/2012 | Hasumi et al. |
| 8,552,653 | B2 | 10/2013 | Kitazawa et al. |
| 8,907,876 | B2 | 12/2014 | Hasumi et al. |
| 9,520,411 | B2 | 12/2016 | Takahashi et al. |
| 10,002,972 | B2 | 6/2018 | Miyake |
| 10,332,912 | B2 | 6/2019 | Takahashi et al. |
| 11,048,134 | B2 | 6/2021 | Kawashima et al. |
| 11,189,643 | B2 | 11/2021 | Kawashima et al. |
| 11,783,757 | B2 | 10/2023 | Takahashi et al. |
| 2004/0070557 | A1 | 4/2004 | Asano et al. |
| 2004/0207614 | A1* | 10/2004 | Yamashita ........... G09G 3/3258 |
| | | | 345/211 |
| 2005/0156828 | A1 | 7/2005 | Yamashita et al. |
| 2006/0022305 | A1 | 2/2006 | Yamashita |
| 2006/0066528 | A1 | 3/2006 | Hara |
| 2007/0132693 | A1* | 6/2007 | Akimoto .............. G09G 3/3258 |
| | | | 345/92 |
| 2007/0236440 | A1 | 10/2007 | Wacyk et al. |
| 2010/0207920 | A1* | 8/2010 | Chaji ................... G09G 3/3233 |
| | | | 345/76 |
| 2011/0164071 | A1* | 7/2011 | Chung .................. H05B 45/60 |
| | | | 315/291 |
| 2011/0205220 | A1* | 8/2011 | Ota ...................... G09G 3/3233 |
| | | | 345/212 |
| 2012/0002133 | A1 | 1/2012 | Yamazaki et al. |
| 2013/0082906 | A1 | 4/2013 | Toyomura et al. |
| 2016/0232834 | A1 | 8/2016 | Kimura et al. |
| 2016/0300900 | A1 | 10/2016 | Miyake |
| 2017/0039935 | A1 | 2/2017 | Yang et al. |
| 2017/0179092 | A1 | 6/2017 | Sasaki et al. |
| 2021/0210517 | A1 | 7/2021 | Kawashima et al. |
| 2021/0343243 | A1 | 11/2021 | Takahashi et al. |
| 2022/0028330 | A1 | 1/2022 | Hwang et al. |
| 2022/0036813 | A1 | 2/2022 | Hwang et al. |
| 2022/0181428 | A1 | 6/2022 | Kobayashi et al. |
| 2022/0416008 | A1 | 12/2022 | Hirose et al. |

FOREIGN PATENT DOCUMENTS

| | | |
|---|---|---|
| CN | 102598095 A | 7/2012 |
| CN | 105280141 A | 1/2016 |
| CN | 106469539 A | 3/2017 |
| EP | 1455335 A | 9/2004 |
| EP | 3128511 A | 2/2017 |
| JP | 2003-043999 A | 2/2003 |
| JP | 2003-241711 A | 8/2003 |
| JP | 2006-126779 A | 5/2006 |
| JP | 2006-209053 A | 8/2006 |
| JP | 2006-309104 A | 11/2006 |
| JP | 2012-123355 A | 6/2012 |
| JP | 2013-076812 A | 4/2013 |
| JP | 2017-010000 A | 1/2017 |
| KR | 2006-0048834 A | 5/2006 |
| TW | 200614118 | 5/2006 |
| TW | 200727248 | 7/2007 |
| TW | 201706978 | 2/2017 |
| WO | WO-2003/052728 | 6/2003 |
| WO | WO-2007/120475 | 10/2007 |
| WO | WO-2011/058885 | 5/2011 |

OTHER PUBLICATIONS

International Search Report (Application No. PCT/IB2019/053801) Dated Sep. 10, 2019.

Written Opinion (Application No. PCT/IB2019/053801) Dated Sep. 10, 2019.

* cited by examiner

FIG. 3A <u>20A</u>
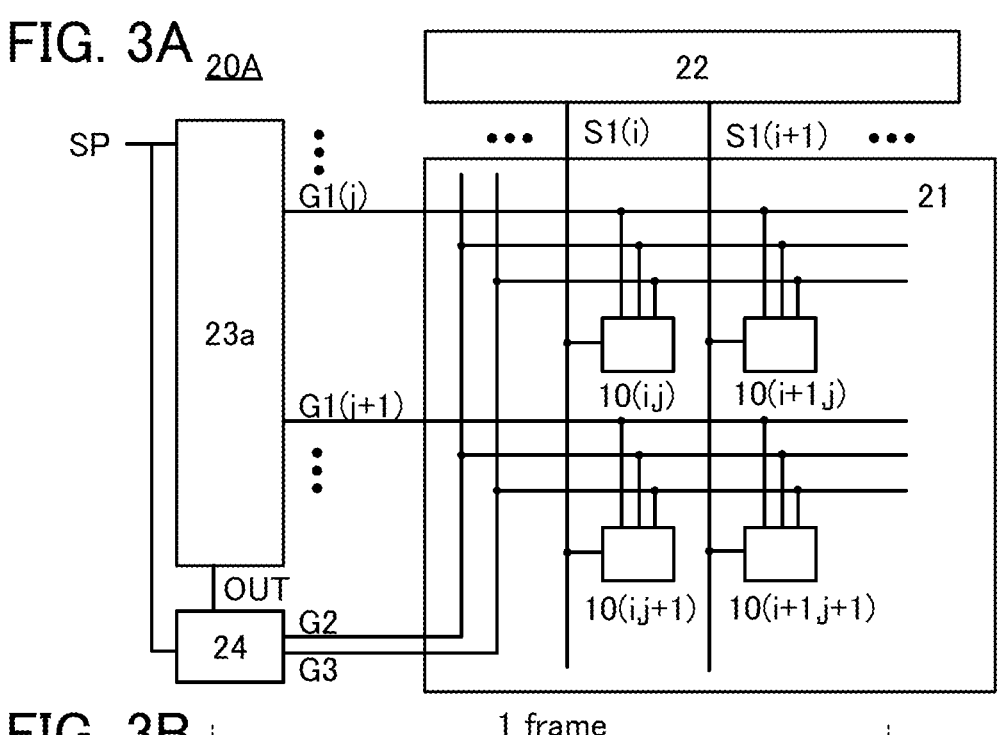
FIG. 3B
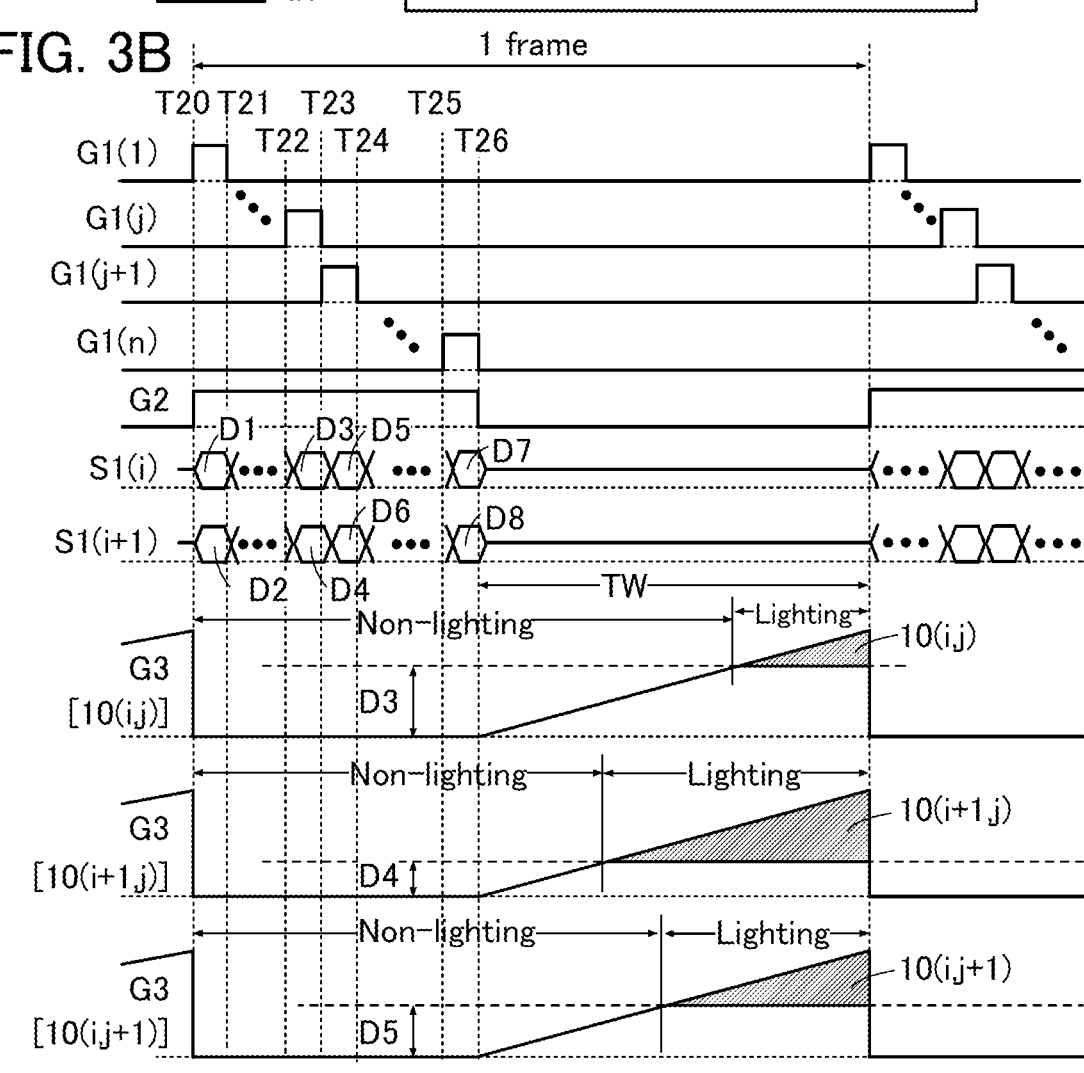

FIG. 12A1
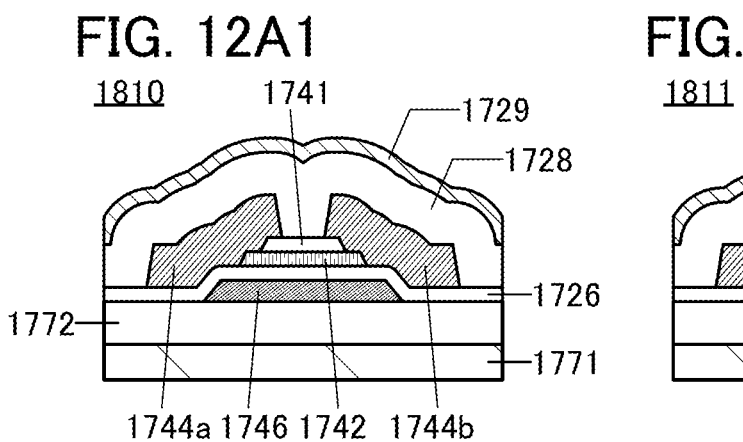
FIG. 12A2
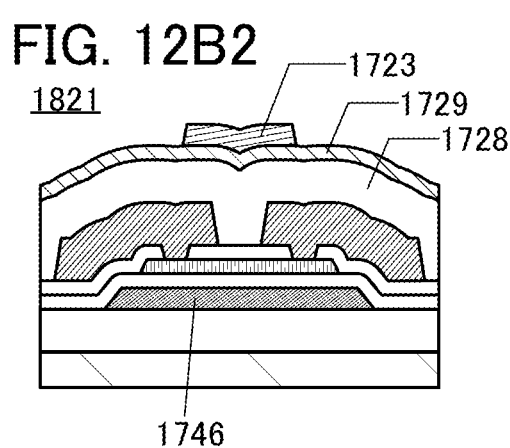
FIG. 12B1
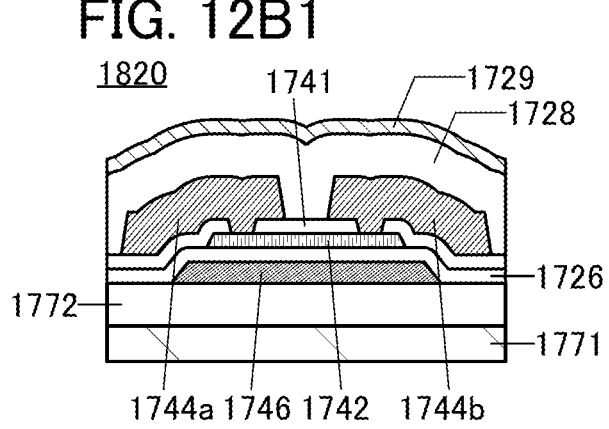
FIG. 12B2
FIG. 12C1
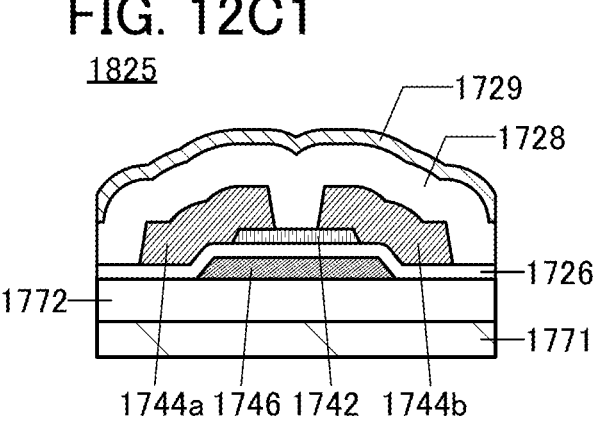
FIG. 12C2
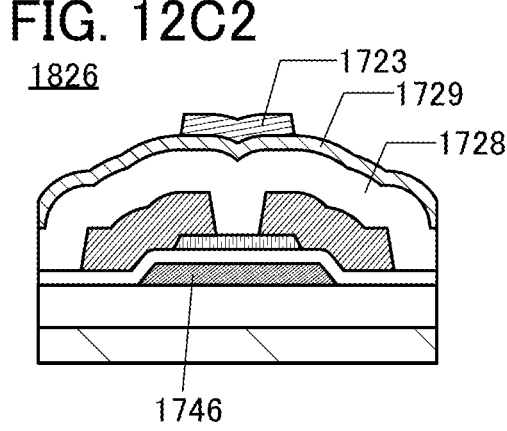

FIG. 13A1
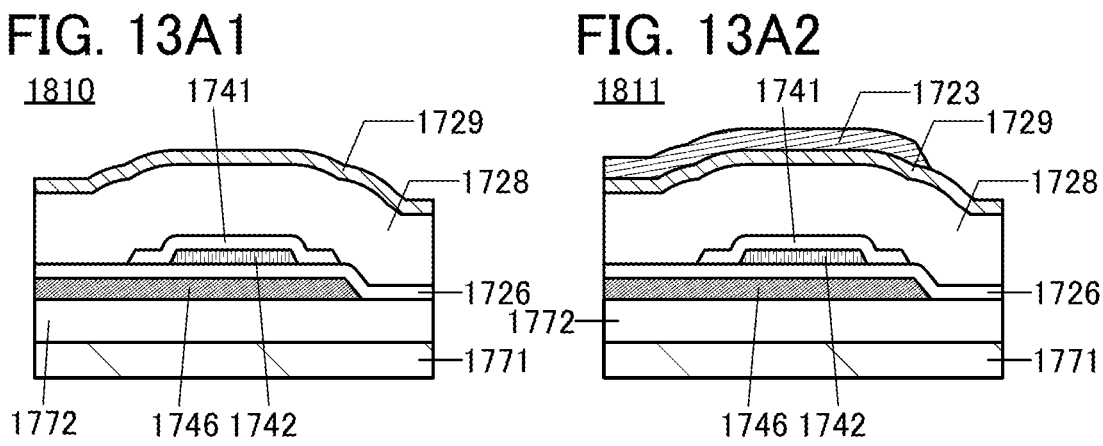
FIG. 13A2
FIG. 13B1
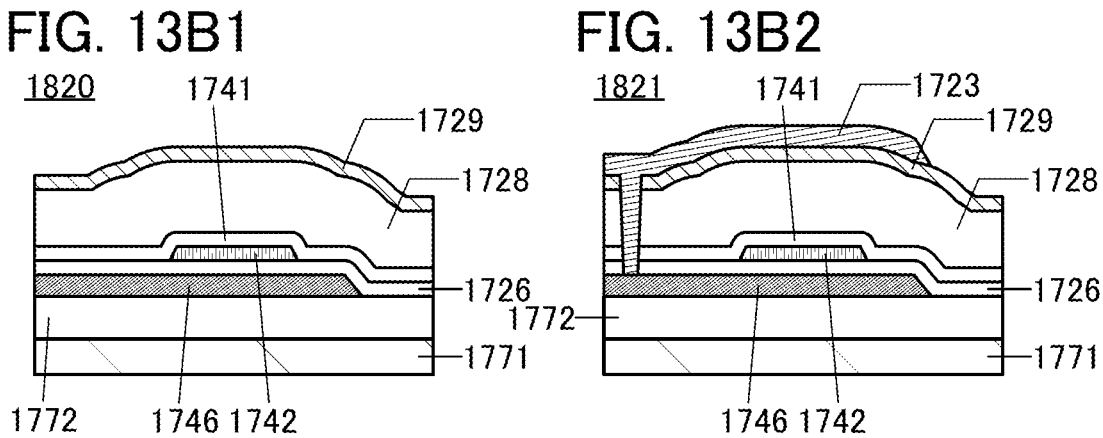
FIG. 13B2
FIG. 13C1
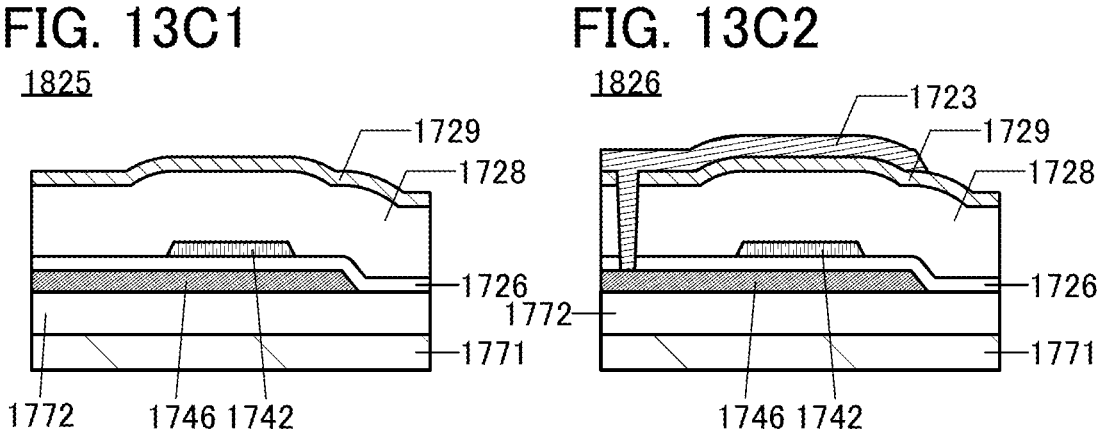
FIG. 13C2

FIG. 14A1
1842
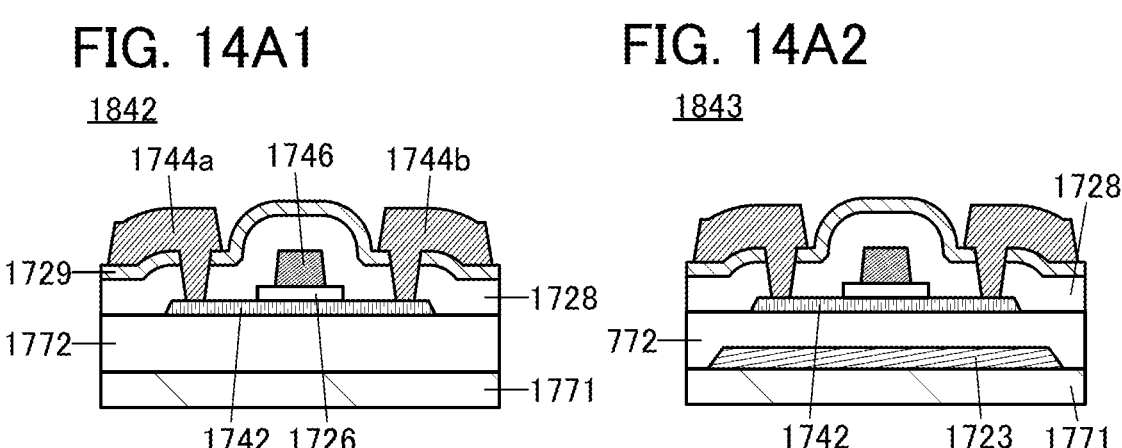
FIG. 14A2
1843
FIG. 14B1
1844
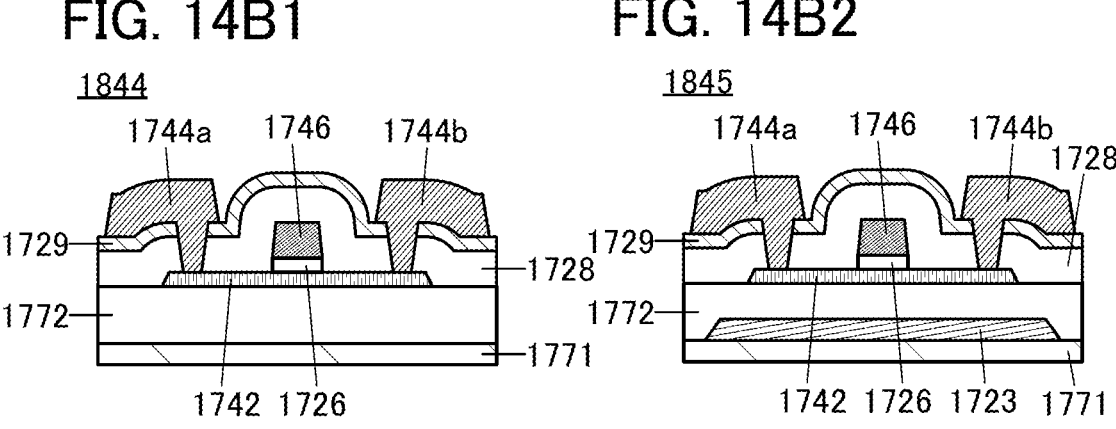
FIG. 14B2
1845
FIG. 14C1
1846
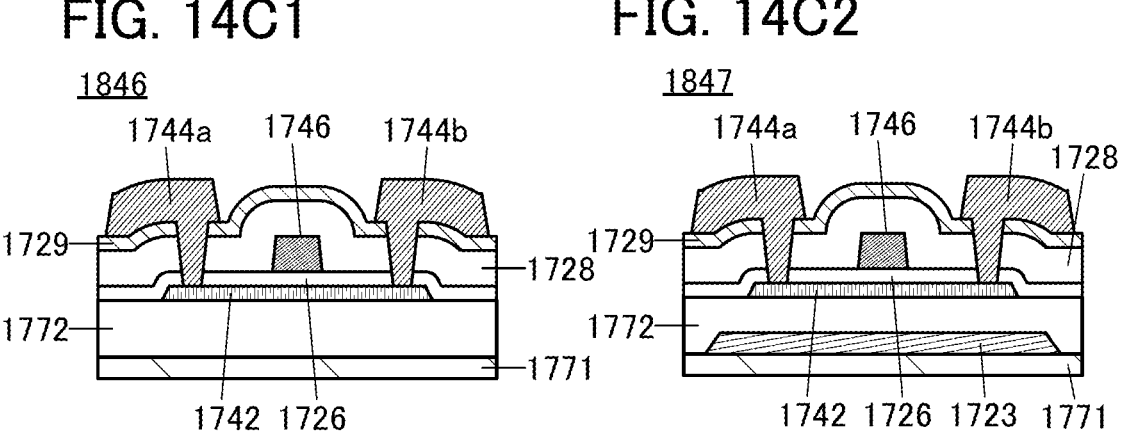
FIG. 14C2
1847

FIG. 15A1
1842
1746 · 1729 · 1728 · 1772 · 1742 · 1726 · 1771
FIG. 15A2
1843
1746 · 1729 · 1728 · 1772 · 1771 · 1742 · 1726 · 1723
FIG. 15B1
1844
1746 · 1729 · 1728 · 1771 · 1772 · 1742 · 1726
FIG. 15B2
1845
1746 · 1729 · 1728 · 1772 · 1771 · 1742 · 1726 · 1723
FIG. 15C1
1846
1746 · 1729 · 1728 · 1771 · 1772 · 1742 · 1726
FIG. 15C2
1847
1746 · 1729 · 1728 · 1772 · 1771 · 1742 · 1726 · 1723
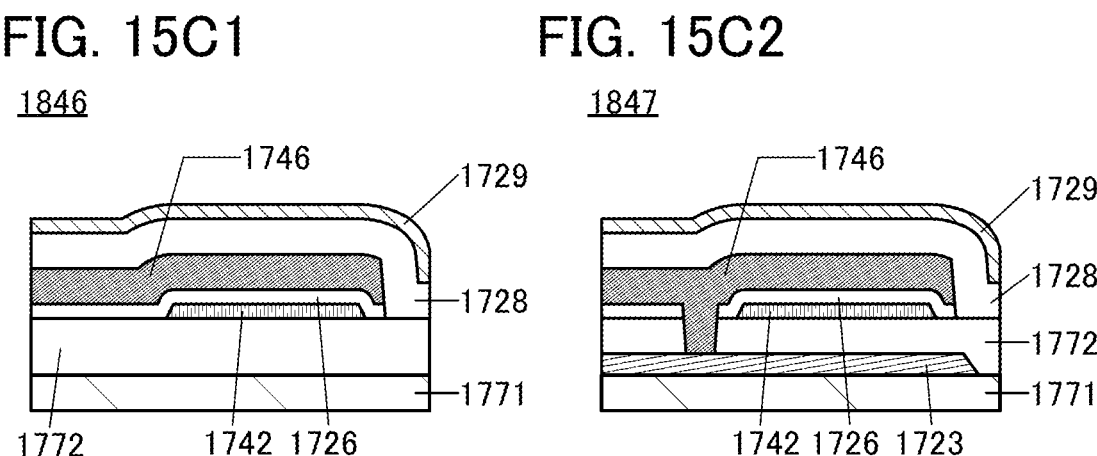

FIG. 16A
5200B
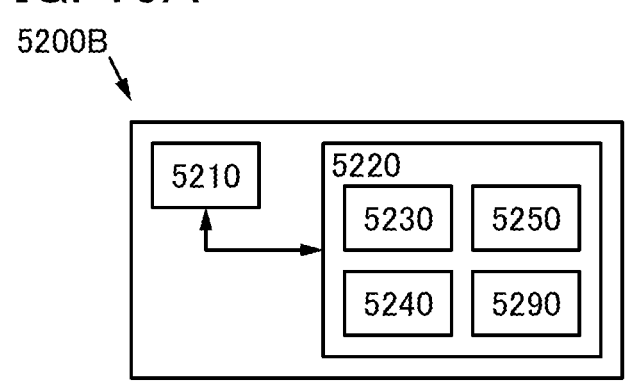
FIG. 16B
5200B
5210, 5290
5250
5230, 5240
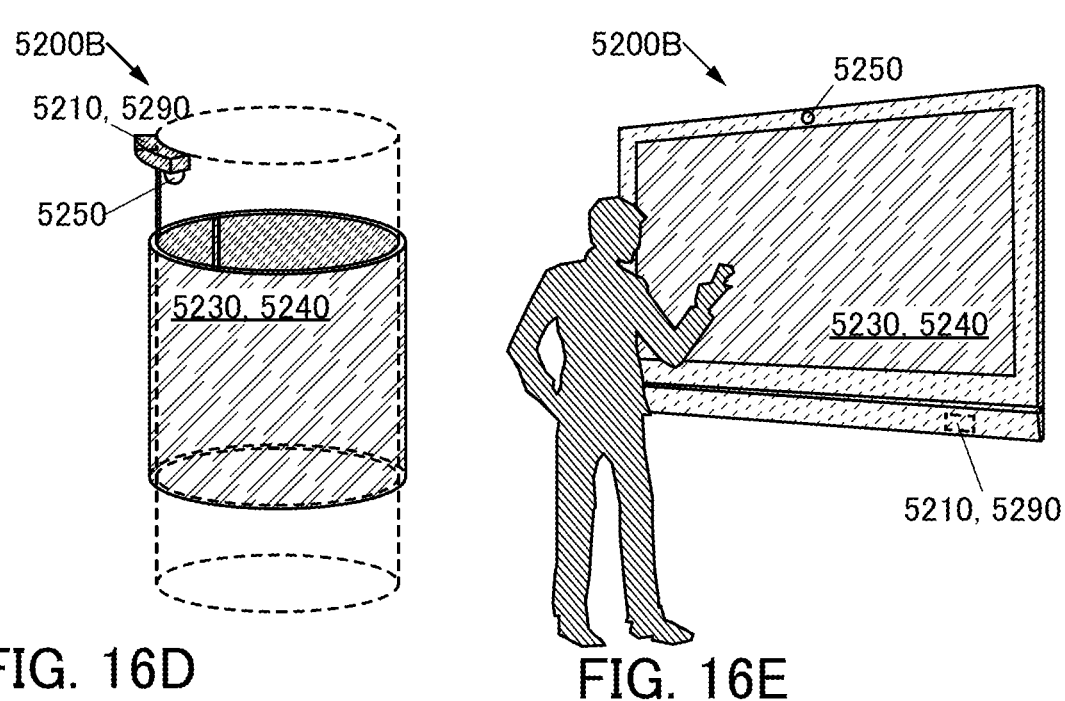
FIG. 16C
5200B
5250
5230, 5240
5210, 5290
FIG. 16D
5200B
5230
5250
5240
5210, 5290
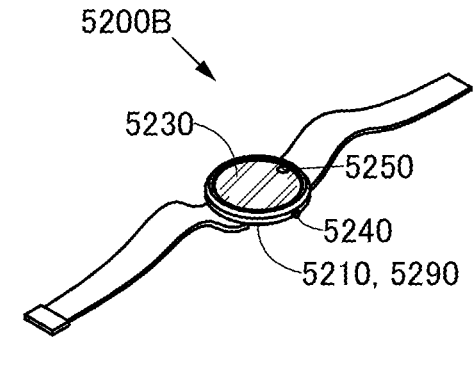
FIG. 16E
5200B
5250
5230, 5240
5210, 5290

DISPLAY DEVICE AND METHOD FOR DRIVING DISPLAY DEVICE

CROSS REFERENCE TO RELATED APPLICATIONS

This application is a divisional of U.S. application Ser. No. 17/052,833, filed Nov. 4, 2020, now allowed, which is which is incorporated by reference and is a U.S. National Phase Application under 35 U.S.C. § 371 of International Application PCT/IB2019/053801, filed on May 9, 2019, which is incorporated by reference and claims the benefit of a foreign priority application filed in Japan on May 18, 2018, as Application No. 2018-095963.

TECHNICAL FIELD

One embodiment of the present invention relates to a display device and a method for driving a display device.

Note that one embodiment of the present invention is not limited to the above technical field. The technical field of one embodiment of the invention disclosed in this specification and the like relates to an object, a method, or a manufacturing method. Alternatively, the present invention relates to a process, a machine, manufacture, or a composition (a composition of matter). In particular, one embodiment of the present invention relates to a semiconductor device, a display device, a light-emitting device, a power storage device, a memory device, a driving method thereof, or a manufacturing method thereof.

Note that in this specification and the like, a semiconductor device means an element, a circuit, a device, or the like that can function by utilizing semiconductor characteristics. For example, a semiconductor element such as a transistor or a diode is a semiconductor device. For another example, a circuit including a semiconductor element is a semiconductor device. For another example, a device provided with a circuit including a semiconductor element is a semiconductor device.

BACKGROUND ART

Electronic devices provided with display devices are widely used. Display devices used in electronic devices need to be capable of displaying more information. For example, in a liquid crystal display device, a driving method such as a field-sequential method in which light sources having a plurality of different hues are sequentially turned on to display a larger amount of information has been proposed. In the field-sequential method, display is performed by sequentially emitting lights having different hues in one pixel; thus, the amount of information to be displayed can be increased.

Patent Document 1 discloses PWM (Pulse Width Modulation) driving using a triangle wave as a method for controlling lighting or non-lighting of light sources having a plurality of hues that are used as a backlight.

Patent Document 2 discloses a display device using a small LED as a light-emitting element in a large display device such as a TV or a signage device or a wearable electronic device such as a head-mounted display.

PRIOR ART DOCUMENTS

Patent Documents

[Patent Document 1] Japanese Published Patent Application No. 2006-209053
[Patent Document 2] United States Published Patent Application No. 2017/0179092

SUMMARY OF THE INVENTION

Problems to be Solved by the Invention

A display device including a liquid crystal element that performs display using a single light source and color filters of three colors has problems such as a difficulty of displaying black without turning off a backlight and a difficulty of increasing contrast. In a field-sequential method, display is performed by sequentially emitting lights having different hues in one pixel; thus, a subpixel is not necessarily provided and the pixel size can be reduced. Accordingly, the field-sequential method is suitable for achieving higher definition. However, there is a problem of an increase in power consumption caused by emission or non-emission of lights having a plurality of hues.

In addition, a head-mounted display or the like is mounted on a body; thus, reductions in weight and power consumption are needed. For example, the head-mounted display or the like needs to have a large battery when power consumption increases, and a user's body bears a large burden when a head-mounted display whose load as an electronic device is large is mounted on the body, which is problematic.

In view of the above problems, an object of one embodiment of the present invention is to provide a display device with a novel structure. Another object of one embodiment of the present invention is to provide a novel method for driving a display device. Another object of one embodiment of the present invention is to provide a method for driving a display device that reduces power consumption. Another object of one embodiment of the present invention is to provide a method for driving a display device that improves display contrast.

Note that the description of these objects does not disturb the existence of other objects. Note that in one embodiment of the present invention, there is no need to achieve all these objects. Note that objects other than these will be apparent from the description of the specification, the drawings, the claims, and the like, and objects other than these can be derived from the description of the specification, the drawings, the claims, and the like.

Note that the objects of one embodiment of the present invention are not limited to the objects listed above. The objects listed above do not preclude the existence of other objects. The other objects are objects that are not described in this section and will be described below. The objects that are not described in this section will be derived from the descriptions of the specification, the drawings, and the like and can be extracted from these descriptions by those skilled in the art. Note that one embodiment of the present invention is to solve at least one of the objects listed above and/or the other objects.

Means for Solving the Problems

One embodiment of the present invention is a method for driving a display device including a first pixel, a second pixel, a first wiring, a second wiring, and a third wiring. The first wiring is electrically connected to the first pixel and the second pixel. The second wiring is electrically connected to the first pixel, and the third wiring is electrically connected to the second pixel. First display data is input to the first pixel through the second wiring, and second display data is input to the second pixel through the third wiring. The first pixel or the second pixel starts to emit light at a different time. At a second time before a first time, the first pixel reaches the maximum luminance corresponding to the first display data and the second pixel reaches the maximum luminance corresponding to the second display data. The first pixel and the second pixel are initialized at the second time by input of a reset signal to the first wiring to stop light emission.

One embodiment of the present invention is a method for driving a display device including a plurality of pixels, a first wiring, a second wiring, and a third wiring. The pixel includes a light-emitting element and first to third transistors. The first transistor includes a first gate and a second gate. The first gate of the first transistor is electrically connected to the first wiring, the second gate of the first transistor is electrically connected to the second wiring, and one of a source and a drain of the first transistor is electrically connected to a gate of the second transistor and one of a source and a drain of the third transistor. One of a source and a drain of the second transistor is electrically connected to one electrode of the light-emitting element. A gate of the third transistor is electrically connected to the third wiring. Threshold voltage of the first transistor is determined in accordance with a first potential of display data by input of the display data to the first wiring. A triangle wave is input to the second wiring. When the first transistor is set in an on state in accordance with a potential of the triangle wave, a second potential is applied to the gate of the second transistor through the first transistor, and emission luminance of the light-emitting element is controlled in accordance with the second potential. The third transistor is set in an on state, the second transistor is set in an off state, and the light-emitting element is turned off by input of a reset signal to the third wiring. The potential of the triangle wave becomes the lowest potential in synchronization with the reset signal.

One embodiment of the present invention is a method for driving a display device including a plurality of pixels, a first wiring, a second wiring, and a third wiring. The pixel includes a light-emitting element, a first transistor, and a second transistor. The first wiring is electrically connected to one electrode of the light-emitting element. One of a source and a drain of the first transistor is electrically connected to the other electrode of the light-emitting element, and a gate of the first transistor is electrically connected to the second wiring and one of a source and a drain of the second transistor. A gate of the second transistor is electrically connected to the third wiring. The amount of current that can flow through the first transistor is determined in accordance with a potential of display data by input of the display data to the second wiring. A triangle wave is input to the first wiring. The amount of current input from the first transistor to the light-emitting element is determined in accordance with a potential of the triangle wave, and emission luminance of the light-emitting element is controlled in accordance with the potential of the triangle wave. A third transistor is set in an on state and the first transistor is set in an off state by input of a reset signal to the third wiring. The potential of the triangle wave becomes the lowest potential in synchronization with the reset signal, and the light-emitting element is turned off

One embodiment of the present invention is a display device including a plurality of pixels and first to sixth wirings. The pixel includes a light-emitting element, first to fourth transistors, a first capacitor, and a second capacitor. Display data is input to the first wiring. A scan signal is input to the second wiring. A reset signal is input to the third wiring. A triangle wave is input to the fourth wiring. A potential higher than that of the display data is applied to the fifth wiring. A potential lower than that of the display data is applied to the sixth wiring. A gate of the fourth transistor is electrically connected to the second wiring. One of a source and a drain of the fourth transistor is electrically connected to the first wiring. A gate of the first transistor is electrically connected to the fourth wiring. The other of the source and the drain of the fourth transistor is electrically connected to a back gate of the first transistor and one electrode of the first capacitor. A gate of the third transistor is electrically connected to the third wiring. The fifth wiring is electrically connected to the other electrode of the first capacitor and one of a source and a drain of the first transistor. The other of the source and the drain of the first transistor is electrically connected to one of a source and a drain of the third transistor, a gate of the second transistor, and one electrode of the second capacitor. The other of the source and the drain of the third transistor is electrically connected to the sixth wiring. One of a source and a drain of the second transistor is electrically connected to one electrode of the light-emitting element.

One embodiment of the present invention is a display device including a plurality of pixels and first to fifth wirings. The pixel includes a light-emitting element, first to third transistors, and a first capacitor. A triangle wave is input to the first wiring. A scan signal is input to the second wiring. A reset signal is input to the third wiring. Display data is input to the fourth wiring. A low potential lower than that of the display data is applied to the fifth wiring. A gate of the third transistor is electrically connected to the second wiring. One of a source and a drain of the third transistor is electrically connected to the fourth wiring. The other of the source and the drain of the third transistor is electrically connected to a gate of the first transistor, one of a source and a drain of the second transistor, and one electrode of the first capacitor. A gate of the second transistor is electrically connected to the third wiring. The other of the source and the drain of the second transistor is electrically connected to the fifth wiring. One of a source and a drain of the first transistor is electrically connected to one electrode of the light-emitting element. The other electrode of the light-emitting element is electrically connected to the first wiring.

In each of the above structures, the light-emitting element in the display device is preferably an LED.

In each of the above structures, the light-emitting element in the display device is preferably an OLED.

In each of the above structures, any one of the transistors included in the display device preferably includes a metal oxide in a semiconductor layer.

Effect of the Invention

One embodiment of the present invention can provide a display device with a novel structure. Another embodiment of the present invention can provide a novel method for driving a display device. Another embodiment of the present invention can provide a method for driving a display device that reduces power consumption. Another embodiment of the present invention can provide a method for driving a display device that improves display contrast.

Note that the effects of one embodiment of the present invention are not limited to the effects listed above. The effects listed above do not preclude the existence of other effects. The other effects are effects that are not described in this section and will be described below. The other effects that are not described in this section will be derived from the descriptions of the specification, the drawings, and the like and can be extracted from these descriptions by those skilled in the art. Note that one embodiment of the present invention is to have at least one of the effects listed above and/or the other effects. Therefore, one embodiment of the present invention does not have the effects listed above in some cases.

BRIEF DESCRIPTION OF THE DRAWINGS

FIG. 3 (A) A block diagram illustrating a display device, and (B) a timing chart illustrating operation of the display device.

Figure 11:
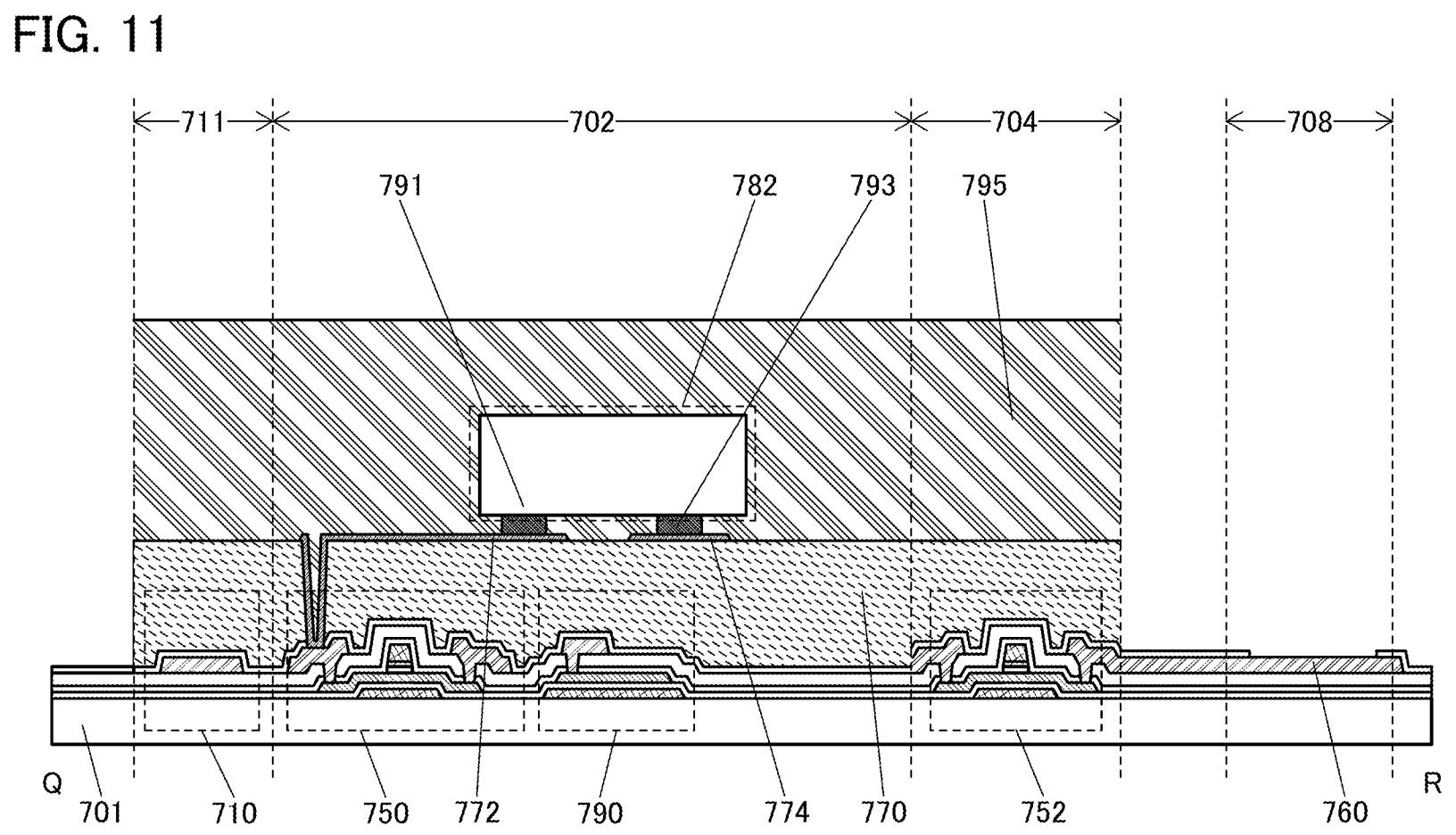

FIG. 11 A diagram illustrating a method for manufacturing a display device.

FIG. 12 (A1) to (C2) Diagrams illustrating transistors.

FIG. 13 (A1) to (C2) Diagrams illustrating transistors.

FIG. 14 (A1) to (C2) Diagrams illustrating transistors.

FIG. 15 (A1) to (C2) Diagrams illustrating transistors.

FIG. 16 (A) to (E) Diagrams illustrating a data processing device.

MODE FOR CARRYING OUT THE INVENTION

Figure 1A:
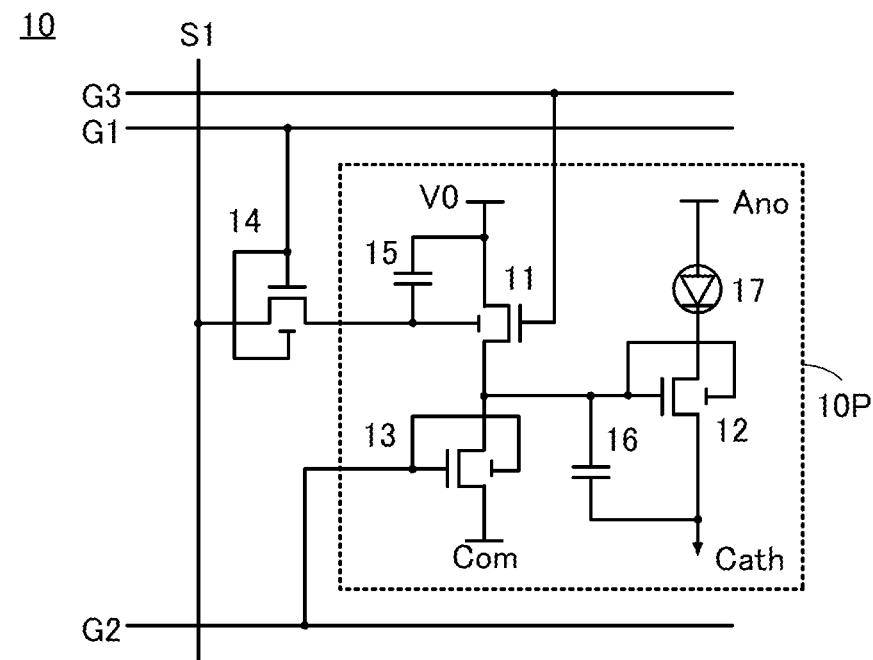
FIG. 1 (A) A circuit diagram illustrating a pixel, and (B) a timing chart illustrating operation of a display device.

Embodiments will be described below with reference to the drawings. Note that the embodiments can be implemented with many different modes, and it will be readily understood by those skilled in the art that modes and details thereof can be changed in various ways without departing from the spirit and scope thereof. Therefore, the present invention should not be construed as being limited to the description of embodiments below.

In addition, in the drawings, the size, the layer thickness, or the region is exaggerated for clarity in some cases. Therefore, the size, the layer thickness, or the region is not limited to the illustrated scale. Note that the drawings schematically illustrate ideal examples, and embodiments of the present invention are not limited to shapes, values, and the like shown in the drawings.

Furthermore, ordinal numbers such as "first," "second," and "third" used in this specification are used in order to avoid confusion among components, and the terms do not limit the components numerically.

In addition, in this specification, terms for describing arrangement, such as "over" and "under," are used for convenience to describe the positional relationship between components with reference to drawings. Furthermore, the positional relationship between components is changed as appropriate in accordance with a direction in which the components are described. Thus, terms for the description are not limited to terms used in the specification, and description can be made appropriately depending on the situation.

In addition, in this specification and the like, a transistor is an element having at least three terminals of a gate, a drain, and a source. The transistor includes a channel formation region between a drain (a drain terminal, a drain region, or a drain electrode) and a source (a source terminal, a source region, or a source electrode), and current can flow between the source and the drain through the channel formation region. Note that in this specification and the like, a channel formation region refers to a region through which current mainly flows.

Furthermore, functions of a source and a drain are sometimes interchanged with each other when a transistor of opposite polarity is employed or the direction of current is changed in circuit operation, for example. Therefore, the terms "source" and "drain" can be used interchangeably in this specification and the like.

Furthermore, in this specification and the like, "electrically connected" includes the case where connection is made through an "object having any electric action." Here, there is no particular limitation on the "object having any electric action" as long as electric signals can be transmitted and received between the connected components. Examples of the "object having any electric action" include a switching element such as a transistor, a resistor, an inductor, a capacitor, and other elements with a variety of functions as well as an electrode and a wiring.

In addition, in this specification and the like, "parallel" indicates a state where two straight lines are placed at an angle of greater than or equal to −10° and less than or equal to 10°. Accordingly, the case where the angle is greater than or equal to −5° and less than or equal to 5° is also included. Furthermore, "perpendicular" indicates a state where two straight lines are placed at an angle of greater than or equal to 80° and less than or equal to 100°. Accordingly, the case where the angle is greater than or equal to 85° and less than or equal to 95° is also included.

Furthermore, in this specification and the like, the term "film" and the term "layer" can be interchanged with each other. For example, the term "conductive layer" can be changed into the term "conductive film" in some cases. Alternatively, for example, the term "insulating film" can be changed into the term "insulating layer" in some cases.

Furthermore, unless otherwise specified, off-state current in this specification and the like refers to drain current of a transistor in an off state (also referred to as a non-conducting state or a cutoff state). Unless otherwise specified, the off state of an n-channel transistor refers to a state where voltage Vgs between its gate and source is lower than the threshold voltage Vth, and the off state of a p-channel transistor refers to a state where the voltage Vgs between its gate and source is higher than the threshold voltage Vth. For example, the off-state current of an n-channel transistor sometimes refers to drain current at the time when the voltage Vgs between its gate and source is lower than the threshold voltage Vth.

The off-state current of a transistor depends on Vgs in some cases. Thus, "the off-state current of a transistor is lower than or equal to I" means "there is Vgs with which the off-state current of a transistor becomes lower than or equal to I" in some cases. The off-state current of a transistor refers to off-state current in an off state at predetermined Vgs, in an off state at Vgs in a predetermined range, in an off state at Vgs with which sufficiently reduced off-state current is obtained, or the like in some cases.

As an example, assumption is made of an n-channel transistor where the threshold voltage Vth is 0.5 V and drain current is $1 \times 10^{-9}$ A at Vgs of 0.5 V, $1 \times 10^{-13}$ A at Vgs of 0.1 V, $1 \times 10^{-19}$ A at Vgs of –0.5 V, and $1 \times 10^{-22}$ A at Vgs of –0.8 V. The drain current of the transistor is lower than or equal to $1 \times 10^{-19}$ A at Vgs of –0.5 V or at Vgs in the range of –0.8 V to –0.5 V; thus, it might be said that the off-state current of the transistor is lower than or equal to $1 \times 10^{-19}$ A. Since there is Vgs at which the drain current of the transistor is lower than or equal to $1 \times 10^{-22}$ A, it might be said that the off-state current of the transistor is lower than or equal to $1 \times 10^{-22}$ A.

In addition, in this specification and the like, the off-state current of a transistor with a channel width W is sometimes represented by a current value per channel width W. Alternatively, it is sometimes represented by the value of flowing current per given channel width (e.g., 1 μm). In the latter case, the off-state current is sometimes represented in the unit with the dimension of current per length (e.g., A/μm).

The off-state current of a transistor depends on temperature in some cases. Unless otherwise specified, the off-state current in this specification sometimes refers to off-state current at room temperature, 60° C., 85° C., 95° C., or 125° C. Alternatively, the off-state current sometimes refers to off-state current at a temperature at which reliability of a semiconductor device or the like including the transistor is ensured or a temperature at which a semiconductor device or the like including the transistor is used (e.g., any temperature in the range of 5° C. to 35° C.). The description "off-state current of a transistor is lower than or equal to I" sometimes means that there is Vgs at which the off-state current of a transistor is lower than or equal to I at room temperature, 60° C., 85° C., 95° C., 125° C., temperature at which reliability of a semiconductor device or the like including the transistor is ensured, or temperature at which a semiconductor device or the like including the transistor is used (e.g., any temperature in the range of 5° C. to 35° C.).

The off-state current of a transistor depends on voltage Vds between its drain and source in some cases. Unless otherwise specified, the off-state current in this specification sometimes refers to off-state current at Vds of 0.1 V, 0.8 V, 1 V, 1.2 V, 1.8 V, 2.5 V, 3 V, 3.3 V, 10 V, 12 V, 16 V, or 20 V. Alternatively, the off-state current sometimes refers to off-state current at Vds at which reliability of a semiconductor device or the like including the transistor is ensured or Vds at which a semiconductor device or the like including the transistor is used. The description "off-state current of a transistor is lower than or equal to I" sometimes means that there is Vgs at which the off-state current of a transistor is lower than or equal to I at Vds of 0.1 V, 0.8 V, 1V, 1.2 V, 1.8 V, 2.5 V, 3 V, 3.3 V, 10 V, 12 V, 16 V, or 20 V, Vds at which reliability of a semiconductor device or the like including the transistor is ensured, or Vds at which a semiconductor device or the like including the transistor is used.

In the above description of off-state current, the drain may be replaced with the source. That is, the off-state current sometimes refers to current that flows through a source of a transistor in an off state.

In addition, in this specification and the like, leakage current sometimes expresses the same meaning as off-state current. Furthermore, in this specification and the like, the off-state current sometimes refers to current that flows between a source and a drain of a transistor in an off state, for example.

Note that voltage refers to a difference between potentials of two points, and a potential refers to electrostatic energy (electric potential energy) of a unit charge at a given point in an electrostatic field. In general, a difference between a potential of one point and a reference potential (e.g., a ground potential) is merely called a potential or voltage, and a potential and voltage are used as synonyms in many cases. Thus, in this specification, a potential may be rephrased as voltage and voltage may be rephrased as a potential unless otherwise specified.

Embodiment 1

In this embodiment, a novel driving method where a light-emitting element is turned on by a triangle wave is described using FIG. 1 to FIG. 3.

First, a display device is described. The display device includes a display panel, a source driver, and a gate driver. The display panel includes a plurality of pixels. Note that in the display panel, the source driver or the gate driver is formed over the same substrate as the pixel. Note that any one or both of the source driver and the gate driver may be constructed as a component different from the display panel and a signal may be supplied to the display panel. In the following description, the display device is sometimes rephrased as the display panel.

For example, the display device includes a first pixel, a second pixel, and first to fifth wirings. The first to third wirings are electrically connected to the first pixel and the second pixel. The fourth wiring is electrically connected to the first pixel, and the fifth wiring is electrically connected to the second pixel. Note that a scan signal is input to the first to third wirings each having a function of a scan line. The scan signal has a function of writing data to a pixel, a function of controlling lighting, a reset function, and the like.

First display data is input to the first pixel through the fourth wiring, and second display data is input to the second pixel through the fifth wiring. The first pixel and the second pixel are initialized at a first time to stop light emission. The first pixel or the second pixel starts to emit light at a different time. In the method for driving a display device, at a second time before the first time, the first pixel reaches the maximum luminance corresponding to the first display data and the second pixel reaches the maximum luminance corresponding to the second display data.

That is, the display data input to the pixel is retained, and then a light-emitting element included in the pixel is turned on by the signal input to the pixel. Note that the first pixel and the second pixel described above are preferably connected to wirings supplied with the same scan signal. The signal input to the pixel is preferably a triangle wave. The triangle wave may be generated using an integration circuit or may be generated using a digital/analog converter circuit. In the case where the triangle wave is generated using an integration circuit, the circuit size can be reduced compared to the case where the triangle wave is generated using a digital/analog converter circuit. In addition, the triangle wave may be a signal having a linear slope or may be a signal that increases exponentially. In the method for driving a display device, in the case where the triangle wave is a signal that increases exponentially, a lighting period is short and the pixel reaches the maximum luminance corresponding to the display data that has a large value compared to the triangle wave having a linear slope.

In addition, a pixel included in the display device is described in detail. The display device includes a plurality of pixels, a first wiring, a second wiring, a third wiring, and a fourth wiring. The pixel includes a light-emitting element and first to fourth transistors. The first transistor includes a first gate and a second gate. Note that any one of the first gate and the second gate corresponds to a gate of the first transistor, and the other of the first gate and the second gate corresponds to a back gate of the first transistor.

The first gate of the first transistor is electrically connected to the first wiring, the second gate of the first transistor is electrically connected to the fourth wiring through the fourth transistor, and one of a source and a drain of the first transistor is electrically connected to a gate of the second transistor and one of a source and a drain of the third transistor. One of a source and a drain of the second transistor is electrically connected to one electrode of the light-emitting element. A gate of the third transistor is electrically connected to the third wiring. A gate of the fourth transistor is electrically connected to the second wiring.

The threshold voltage of the first transistor is determined in accordance with a first potential of display data by input of the display data to the fourth wiring as a first step. That is, a signal input to the second wiring can be written to the pixel as the display data. Note that the pixel may include a first capacitor and a second capacitor. The display data is preferably retained in the first capacitor. In the following description, the first potential is identical to the first display data.

As a second step, a triangle wave is input to the first wiring, a second potential is applied to the gate of the second transistor through the first transistor when the first transistor is set in an on state in accordance with a potential of the triangle wave, and emission luminance is controlled in accordance with the second potential. The second potential is preferably retained in a second storage capacitor. That is, a signal input to the first wiring can control lighting of the pixel.

As a third step, the third transistor is set in an on state by input of a reset signal to the third wiring, the second transistor is set in an off state by discharging of the second potential retained in the second storage capacitor, and the light-emitting element is turned off. In the method for driving a display device, the potential of the triangle wave becomes the lowest potential in synchronization with the reset signal.

Note that the luminance of the light-emitting element that is perceived by human's eyes can be represented by average luminance per hour. The average luminance is determined by the amount of light emitted from the light-emitting element during a period from turning off the light-emitting element by the reset signal to turning off the light-emitting element by the next reset signal. Note that a period from turning on the light-emitting element by the second potential to turning off the light-emitting element by the reset signal is referred to as a lighting period, and a period from turning off the light-emitting element to turning on the light-emitting element by input of the next second potential is referred to as a non-lighting period. That is, the signal input to the third wiring can reset display of the pixel.

It is preferable that the threshold voltage of the first transistor become low in the case where the first potential that is the display data is a low potential and the threshold voltage of the first transistor become high in the case where the first potential is a high potential. That is, in the case where the first potential is a low potential, by input of the triangle wave to the first transistor, the second potential quickly becomes high in accordance with the increase in the potential of the triangle wave, so that the light-emitting element starts to be turned on quickly. In addition, as the light-emitting element starts to be turned on quickly, the average luminance of the light-emitting element becomes high and the maximum luminance during the light emission period of the light-emitting element also becomes high.

The luminance of the light-emitting element with respect to the first potential of the display data applied to the pixel is averaged so as to be the average luminance. However, the luminance of the light-emitting element becomes the maximum luminance corresponding to the display data at a time immediately before the light-emitting element is turned off by the third transistor; thus, the maximum luminance remains as an afterimage in human's eyes. This is because when display data with a low gray level is displayed, a gray level perceived at the average luminance is low whereas the instantaneous maximum luminance remains as an afterimage in human's eyes and is thus easily perceived as a color. For example, in the case where a blue color of the sea illuminated by the moonlight is expressed, there is, for example, an effect that human's eyes strongly perceive the blue color as an afterimage even with a low gray level.

In addition, in the pixel, the second potential is initialized by the third transistor and the light-emitting element is turned off, so that the display device can have an effect of black insertion. Note that black insertion is a method for driving a display device in which a contrast ratio is increased by provision of a period during which display data is displayed and a period during which display data is not displayed. That is, owing to the effect of black insertion, the contrast increases and the instantaneous maximum luminance remains as an afterimage, so that the visibility of display content improves. Furthermore, provision of the non-lighting period can reduce the lighting period and power consumption. Moreover, in the lighting period, the charge voltage of the second potential is controlled by the triangle wave, so that a period with luminance during which the amount of heat generation is large can be reduced. Therefore, the method for driving a display device described above can reduce power consumption and suppress heat generation.

The triangle wave input to the gate of the first transistor through the first wiring is concurrently input to pixels connected to the first wiring. Note that the triangle wave may be concurrently input to all the pixels included in the display device. In the case where the triangle wave is input to all the pixels included in the display device, luminance reaches the maximum luminance corresponding to the size of display data input to each pixel at the first time, so that displays in a display region can be concurrently updated. In addition, initialization and non-lighting of the light-emitting element are performed at the second time. What is called area sequential driving can be achieved. For example, the decrease of visibility that is generated by concurrent display of display data for a p-th frame and display data for a (p−1)th frame in the display region can be suppressed. "p" is a positive natural number.

It is preferable to use an LED as the light-emitting element. The LED may be formed over the display panel, or the LED may be bonded as a component. Alternatively, the light-emitting element may be an OLED. The method for driving a display device of this embodiment can exhibit a similar effect regardless of whether the light-emitting element is an LED or an OLED.

In addition, the light-emitting element included in the pixel may be formed over the display panel, or may be incorporated as a component. For example, the LED may be bonded to the pixel as a component.

Next, the pixel included in the display device will be described in detail using FIG. 1(A).

The display device includes a pixel 10, a wiring G1, a wiring G2, a wiring G3, a wiring S1, a wiring V0, a wiring com, a wiring Ano, and a wiring Cath. Note that the first wiring corresponds to the wiring G3 electrically connected to the first pixel, the second wiring corresponds to the wiring G1 electrically connected to the first pixel, and the third wiring corresponds to the wiring G2 electrically connected to the first pixel. The pixel 10 includes a transistor 14 and a pixel circuit 10P. The pixel circuit 10P includes a light-emitting element 17, a transistor 11, a transistor 12, a transistor 13, a capacitor 15, and a capacitor 16. The transistor 11 includes a back gate.

A gate of the transistor 14 is electrically connected to the wiring G1. One of a source and a drain of the transistor 14 is electrically connected to the wiring S1. The other of the source and the drain of the transistor 14 is electrically connected to a back gate of the transistor 11 and one electrode of the capacitor 15. A gate of the transistor 11 is electrically connected to the wiring G3. The wiring V0 is electrically connected to the other electrode of the capacitor 15 and one of a source and a drain of the transistor 11. The other of the source and the drain of the transistor 11 is electrically connected to one of a source and a drain of the transistor 13, a gate of the transistor 12, and one electrode of the capacitor 16. A gate of the transistor 13 is electrically connected to the wiring G2. The other of the source and the drain of the transistor 13 is electrically connected to a wiring Com. One of a source and a drain of the transistor 12 is electrically connected to one electrode of the light-emitting element 17. The other of the source and the drain of the transistor 12 is electrically connected to the wiring Cath and the other electrode of the capacitor 16. The other electrode of the light-emitting element 17 is electrically connected to the wiring Ano.

Although FIG. 1(A) illustrates the example where each of the transistor 12, the transistor 13, and the transistor 14 includes a back gate, a structure may be employed in which any one or more of the transistor 12, the transistor 13, and the transistor 14 do not include back gates. Note that the transistor preferably includes a highly purified oxide semiconductor film in which formation of oxygen vacancies is suppressed. The transistor can have low off-state current. Thus, the retention time of an electric signal such as an image signal can be made long. Accordingly, the frequency of refresh operations can be reduced, resulting in an effect of reducing power consumption. Note that the transistor including an oxide semiconductor film will be described in detail in Embodiment 6.

A potential that is higher than the maximum potential of the second potential applied to the capacitor 16 is applied to the wiring V0. A low potential for initializing the second potential retained in the capacitor 16 is applied to the wiring Com. The low potential is preferably set to be a current value such that the light-emitting element does not emit light. That is, a potential for setting the transistor 12 in an off state is applied. The wiring Ano is connected to the other electrode (hereinafter an anode terminal) of the light-emitting element. Thus, a potential applied to the wiring Ano is preferably higher than the maximum potential of the second potential. The wiring Cath is connected to the one electrode (hereinafter a cathode terminal) of the light-emitting element through the transistor 12. Therefore, a potential applied to the wiring Cath is preferably lower than the potential for initializing the second potential.

Figure 1B:
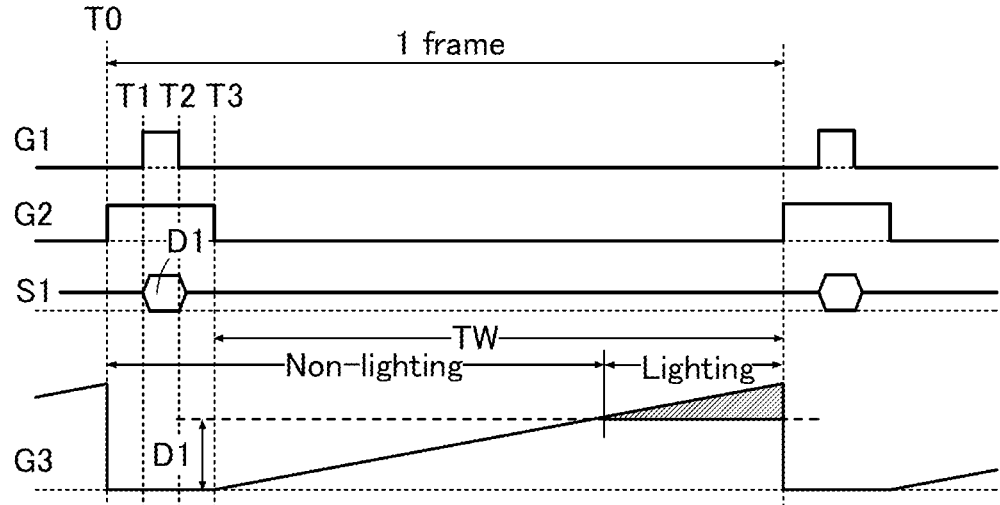

FIG. 1(B) is a timing chart illustrating the operation of the pixel 10. A scan signal is input to the pixel 10, which is connected to the wiring G1, through the wiring G1. A reset signal is input to the pixel 10, which is connected to the wiring G2, through the wiring G2. A triangle wave TW is input to the pixel 10, which is connected to the wiring G3, through the wiring G3. The first potential is applied to the pixel 10, which is connected to the wiring S1, through the wiring S1. Note that the first potential can be rephrased as display data D1.

At Time T0, the reset signal is input to the wiring G2. The reset signal is input to the gate of the transistor 13 through the wiring G2. The transistor 13 is set in an on state, the second potential retained in the capacitor 16 is initialized, and the light-emitting element is turned off. In addition, at Time T0, the triangle wave TW input to the wiring G3 is initialized to stop charge of the second potential. In other words, the transistor 11 is set in an off state, and operation of charging the second potential to the capacitor 16 is stopped.

At Time T1, the wiring G1 is set in a selected state by a scan signal input to the wiring G1. The transistor 14 is set in an on state, and the display data D1 input to the wiring S1 is input to the capacitor 15. The display data D1 input to the capacitor 15 is input to the back gate of the transistor 11, so that the threshold voltage of the transistor 11 is controlled.

At Time T2, the scan signal input to the wiring G1 is set in a non-selected state. Thus, the transistor 14 is set in an off state, and the display data D1 input to the capacitor 15 is retained.

At Time T3, the reset signal input to the wiring G2 is canceled, and the transistor 13 is set in an off state. Note that this cancellation of the reset signal may be performed at Time T2.

In addition, at Time T3, the triangle wave TW is preferably input to the wiring G3 by the cancellation of the reset signal. Note that since the threshold value of the transistor 11 is controlled by the display data D1, charge of the second potential is started in accordance with the display data D1. When charge of the second potential to the capacitor 16 is started, the transistor 12 supplies current to the light-emitting element so that the light-emitting element starts to be turned on. FIG. 1(B) illustrates an example in which the light-emitting element is turned on during a period indicated by a hatched pattern. Furthermore, the emission intensity of the light-emitting element is preferably increased in accordance with the change in the triangle wave TW. Note that in the pixel 10, a period during which the triangle wave TW is input is preferably shorter than one frame.

Figures 2A, 2B:
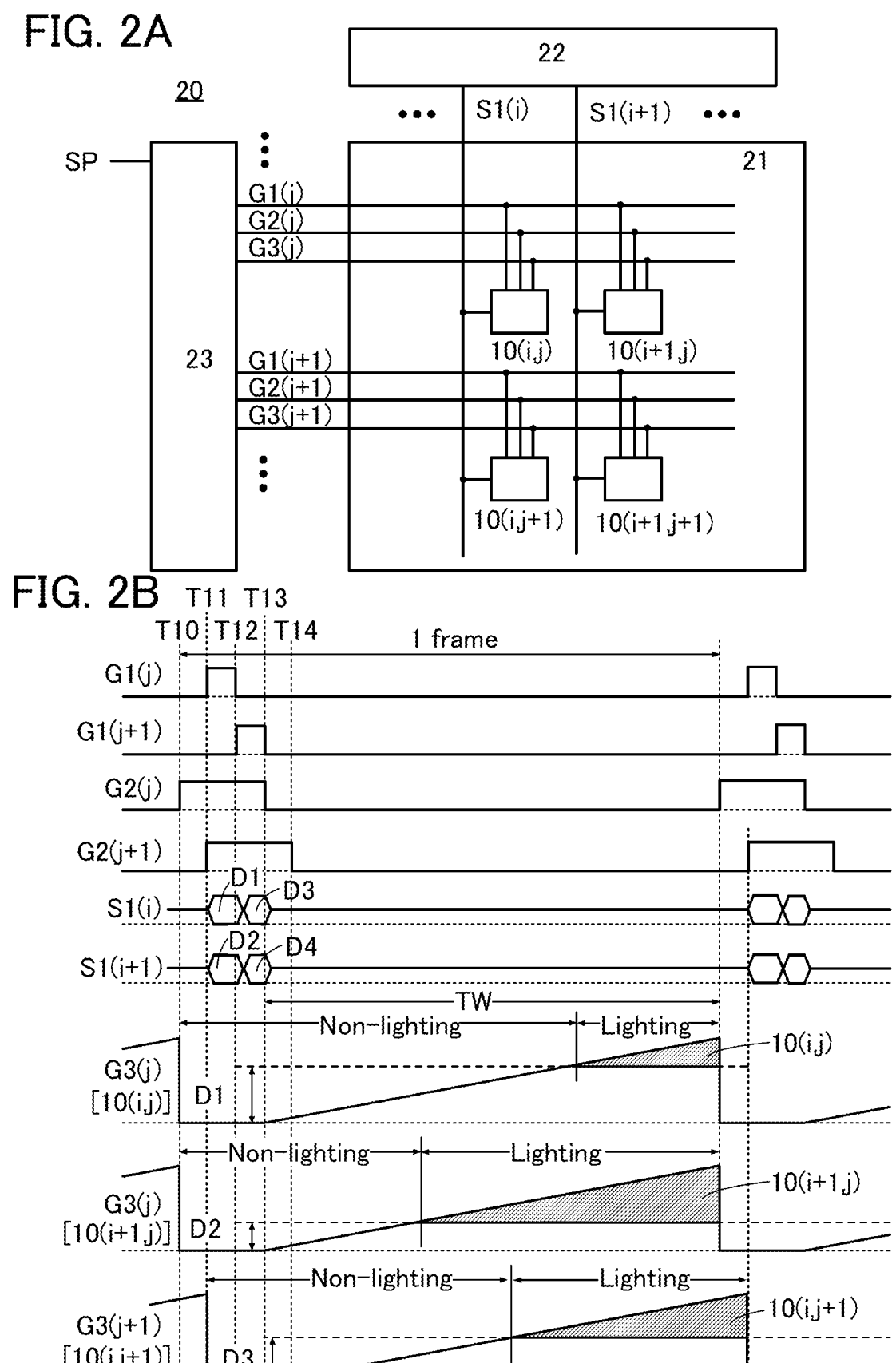
FIG. 2 (A) A block diagram illustrating a display device, and (B) a timing chart illustrating operation of the display device.

FIG. 2(A) is a block diagram illustrating a display device 20. The display device 20 includes a display region 21, a source driver 22, and a gate driver 23. The display region 21 includes a pixel 10(1,1) to a pixel 10(m,n). For example, FIG. 2(A) illustrates a pixel 10(i,j) to a pixel 10(j+1,j+1). "m" and "n" are each a positive integer, "i" is an integer greater than or equal to 1 and less than or equal to m, and "j" is an integer greater than or equal to 1 and less than or equal to n.

For example, connection between the pixel $10(i,j)$ and wirings is described. The pixel $10(i,j)$ is electrically connected to the gate driver 23 through a wiring G1($j$), a wiring G2($j$), or a wiring G3($j$). The pixel $10(i,j)$ is electrically connected to the source driver 22 through a wiring S1($i$).

FIG. 2(B) is a timing chart illustrating the operation of the display device 20. The description of the detailed operation of the pixel 10 is omitted because the description in FIG. 1(B) can be referred to.

At Time T10, a reset signal is input to the wiring G2($j$), retained potentials of the pixel $10(i,j)$ and a pixel $10(i+1,j)$ are initialized, and the light-emitting elements are turned off. In addition, the triangle wave TW input to the wiring G3($j$) is initialized.

At Time T11, the wiring G1($j$) is set in a selected state by a scan signal input to the wiring G1($j$). The display data D1 is input to the wiring S1($i$), and display data D2 is input to a wiring S1($i$+1).

In addition, at Time T11, a reset signal is input to a wiring G2($j$+1), retained potentials of a pixel $10(i,j+1)$ and a pixel $10(i+1,j+1)$ are initialized, and the light-emitting elements are turned off. Furthermore, the triangle wave TW input to a wiring G3($j$+1) is initialized.

At Time T12, the scan signal input to the wiring G1($j$) is set in a non-selected state. Therefore, the display data D1 is retained in the pixel $10(i,j)$, and the display data D2 is retained in the pixel $10(i+1,j)$.

In addition, at Time T12, a wiring G1($j$+1) is set in a selected state by a scan signal input to the wiring G1($j$+1). Display data D3 is input to the wiring S1($i$), and display data D4 is input to the wiring S1($i$+1).

At Time T13, the reset signal input to the wiring G2($j$) is canceled. At Time T13, the triangle wave TW is input to the wiring G3($j$) by the cancellation of the reset signal. Note that the threshold value of the transistor 11 is controlled by the display data D1 or the display data D2, so that the lighting start time of the pixel $10(i,j)$ or the pixel $10(i+1,j)$ is different. Furthermore, the lighting period and emission intensity of the pixel $10(i,j)$ or the pixel $10(i+1,j)$ differ depending on the display data D1 or the display data D2.

In addition, at Time T13, the scan signal input to the wiring G1($j$+1) is set in a non-selected state. Therefore, the display data D3 is retained in the pixel $10(i,j+1)$, and the display data D4 is retained in the pixel $10(i+1,j+1)$.

The timing chart illustrated in FIG. 2(B) shows regions with different lighting periods that are indicated by hatched patterns. The timing chart illustrated in FIG. 2(B) shows an example in which the respective lighting periods differ depending on the value of the potential of the display data D1 that is applied to the pixel $10(i,j)$ or the display data D2 that is applied to the pixel $10(i+1,j)$.

At Time T14, the reset signal input to the wiring G2($j$+1) is canceled. At Time T14, the triangle wave TW is input to the wiring G3($j$+1) by the cancellation of the reset signal. The description of subsequent operations is omitted because similar processings are repeated.

In the timing chart illustrated in FIG. 2(B), the triangle wave TW is input to the wiring G3($j$) or the wiring G3($j$+1) in response to each scan signal input to the wiring G1($j$) or the wiring G1($j$+1). The lighting period differs depending on a selected row, so that the lighting times of the light-emitting elements vary. Thus, the concentration of power consumption due to lighting of the light-emitting elements can be dispersed.

FIG. 3(A) is a block diagram illustrating a display device 20A. The display device 20A differs from the display device 20 in that a gate driver 23a and a triangle wave generation circuit 24 are included.

For example, connection between the pixel $10(i,j)$ and wirings is described. The pixel $10(i,j)$ is electrically connected to the gate driver 23a through the wiring G1($j$), and a pixel $10(i,j+1)$ is electrically connected to the gate driver 23a through the wiring G1($j$+1). Note that the pixel $10(i,j)$ and the pixel $10(i,j+1)$ are electrically connected to the source driver 22 through the wiring S1($i$).

The wiring G2 is electrically connected to a pixel group included in the display region 21, and reset signals can be concurrently input to the pixel group so that the light-emitting elements can be turned off. The wiring G3 is electrically connected to the pixel group, and the triangle wave TW can be concurrently input to all the pixels.

In addition, a start pulse SP is input to the gate driver 23a, and the start pulse SP and an output signal OUT of the gate driver 23a are input to the triangle wave generation circuit 24.

The triangle wave generation circuit 24 can generate reset signals input to the pixel group and the triangle wave TW by using the start pulse SP and the output signal OUT.

FIG. 3(B) is a timing chart illustrating an example of the operation of the display device 20A. In FIG. 3(B), description is made using wirings G1(1) to G1($n$), and description on pixels to which display data are input is made focusing on the pixel $10(i,j)$ to the pixel $10(i+1,j+1)$ of the pixel group. Note that the description of the detailed operation of the pixel 10 is omitted because the description in FIG. 1(B) can be referred to.

At Time T20, the triangle wave generation circuit 24 can input a reset signal to the wiring G2. Thus, the pixel group is initialized at the same time, and the light-emitting elements are turned off. In addition, the triangle wave generation circuit 24 can initialize the triangle wave TW input to the wiring G3. Furthermore, the wiring G1(1) is set in a selected state by a scan signal input to the wiring G1(1). For example, in a pixel $10(i,1)$ to a pixel $10(i+1,1)$ (non-display) in FIG. 3(A), the display data D1 is input to the wiring S1($i$) and the display data D2 is input to the wiring S1($i$+1).

At Time T21, the scan signal input to the wiring G1(1) is set in a non-selected state. Therefore, the display data D1 is retained in the pixel $10(i,1)$, and the display data D2 is retained in the pixel $10(i+1,1)$.

At Time T22, the wiring G1($j$) is set in a selected state by a scan signal input to the wiring G1($j$). The display data D3 is input to the wiring S1($i$), and the display data D4 is input to the wiring S1($i$+1).

At Time T23, the scan signal input to the wiring G1($j$) is set in a non-selected state. Therefore, the display data D3 is retained in the pixel $10(i,j)$, and the display data D4 is retained in the pixel $10(i+1,j)$.

In addition, at Time T23, the wiring G1($j$+1) is set in a selected state by a scan signal input to the wiring G1($j$+1). Display data D5 is input to the wiring S1($i$), and display data D6 is input to the wiring S1($i$+1).

At Time T24, the scan signal input to the wiring G1($j$+1) is set in a non-selected state. Therefore, the display data D5 is retained in the pixel $10(i,j+1)$, and the display data D6 is retained in the pixel $10(i+1,j+1)$.

At Time T25, the wiring G1($n$) is set in a selected state by a scan signal input to the wiring G1($n$). Display data D7 is input to the wiring S1($i$), and display data D8 is input to the wiring S1($i$+1).

At Time T26, the scan signal input to the wiring G1(*n*) is set in a non-selected state. Therefore, the display data D7 is retained in a pixel 10(*i*,*n*), and the display data D8 is retained in a pixel 10(*i*+1,*n*).

At Time T26, the reset signal input to the wiring G2 is canceled. At Time T26, the triangle wave TW is input to the wiring G3 by the cancellation of the reset signal. The threshold value of the transistor 11 included in each pixel is controlled by the display data D1 to the display data D8. For example, FIG. 3(B) shows that the lighting start times of the pixel 10(*i*,*j*), the pixel 10(*i*+1,*j*), and the pixel 10(*i*,*j*+1) are different, as shown by regions with different lighting periods that are indicated by hatched patterns.

In other words, the lighting period and emission intensity of the pixel 10(*i*,*j*), the pixel 10(*i*+1,*j*), or the pixel 10(*i*,*j*+1) differ depending on the display data D3, the display data D4, or the display data D5. The same applies to other pixels. The lighting start time, lighting period, and emission intensity of each pixel differ depending on display data input to each pixel.

In the timing chart illustrated in FIG. 3(B), display data is input to the pixel group, and then the triangle wave TW is input to the pixel group at the same time from the triangle wave generation circuit 24. That is, although the pixel group has a different lighting start time depending on the input display data, the light-emitting elements included in the respective pixels reach the maximum luminance at the same time. At the next time, a reset signal is input to the pixel group by the triangle wave generation circuit 24, and the display data is initialized. In other words, the pixel group has the time at which the light-emitting elements are turned off at the same time and the time at which the light-emitting elements reach the maximum luminance at the same time. The display device can update area display on the display region 21; thus, in the case where display is updated using a scan line, the decrease in visibility that is caused by concurrent display of display data of an update frame to be generated and display data of an old frame can be inhibited.

That is, in the pixel group, the pixel is initialized by the reset signal, and the light-emitting elements are turned off while the reset signal is input. Thus, the reset signal has the effect of black insertion. In other words, in the driving method using the triangle wave TW, owing to the effect of black insertion, the contrast increases and the instantaneous maximum luminance remains as an afterimage, so that the visibility of display content improves. In addition, provision of the non-lighting period can reduce the lighting period, and the triangle wave TW can reduce power consumption and a period with luminance during which the amount of heat generation is large in the lighting period; thus, power consumption can be reduced and heat generation can be suppressed.

The structure and method described in this embodiment can be used in appropriate combination with the structures and methods described in the other embodiments.

Embodiment 2

In this embodiment, structures that are different from those of the pixels and the display devices in Embodiment 1 will be described using FIG. 4 to FIG. 6.

Figure 4A:
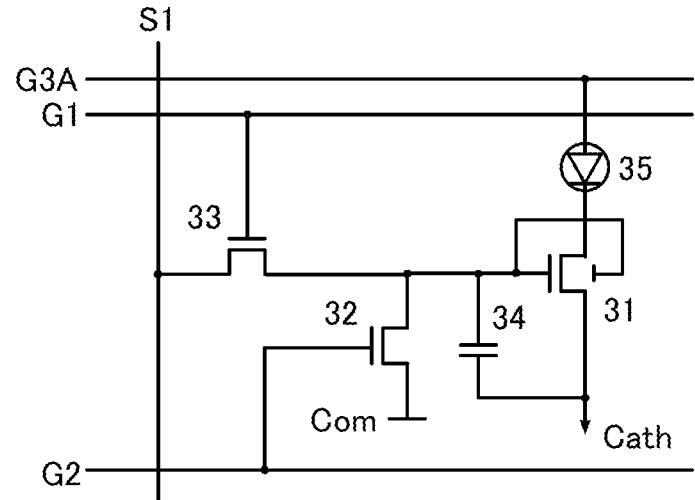
FIG. 4 (A) A circuit diagram illustrating a pixel, and (B) a timing chart illustrating operation of a display device.

FIG. 4(A) illustrates details of a pixel 10A that is different from FIG. 1.

A display device includes the pixel 10A, the wiring G1, the wiring G2, a wiring G3A, the wiring S1, the wiring Com, and the wiring Cath. The pixel 10A includes a light-emitting element 35, a transistor 31, a transistor 32, a transistor 33, and a capacitor 34.

A gate of the transistor 33 is electrically connected to the wiring G1. One of a source and a drain of the transistor 33 is electrically connected to the wiring S1. The other of the source and the drain of the transistor 33 is electrically connected to a gate of the transistor 31, one of a source and a drain of the transistor 32, and one electrode of the capacitor 34. A gate of the transistor 32 is electrically connected to the wiring G2. The other of the source and the drain of the transistor 32 is electrically connected to the wiring Com. One of a source and a drain of the transistor 31 is electrically connected to one electrode of the light-emitting element 35. The other of the source and the drain of the transistor 12 is electrically connected to the wiring Cath and the other electrode of the capacitor 34. The other electrode of the light-emitting element 35 is electrically connected to the wiring G3A.

In FIG. 4(A), each of the transistor 31, the transistor 32, and the transistor 33 may include a back gate. Note that a structure may be employed in which any one or more of the transistor 31, the transistor 32, and the transistor 33 include back gates.

A low potential for initializing the display data D1 retained in the capacitor 34 is applied to the wiring Com. The low potential is preferably set to be a current value such that the light-emitting element does not emit light. That is, a potential for setting the transistor 31 in an off state is applied. The wiring G3A is connected to an anode terminal of the light-emitting element and is supplied with the triangle wave TW. The wiring Cath is connected to a cathode terminal of the light-emitting element through the transistor 31. Therefore, a potential applied to the wiring Cath is preferably lower than the potential for initializing the display data D1.

A scan signal is input to the pixel 10A, which is connected to the wiring G1, through the wiring G1. A reset signal is input to the pixel 10A, which is connected to the wiring G2, through the wiring G2. In the pixel 10A that is connected to the wiring G3A, the triangle wave TW is input to the anode terminal of the light-emitting element through the wiring G3A. The display data D1 is input to the pixel 10, which is connected to the wiring S1, through the wiring S1.

The pixel 10A illustrated in FIG. 4(A) differs from the pixel 10 illustrated in FIG. 1(A) in that the triangle wave TW is input to the anode terminal of the light-emitting element 35.

Figure 4B:
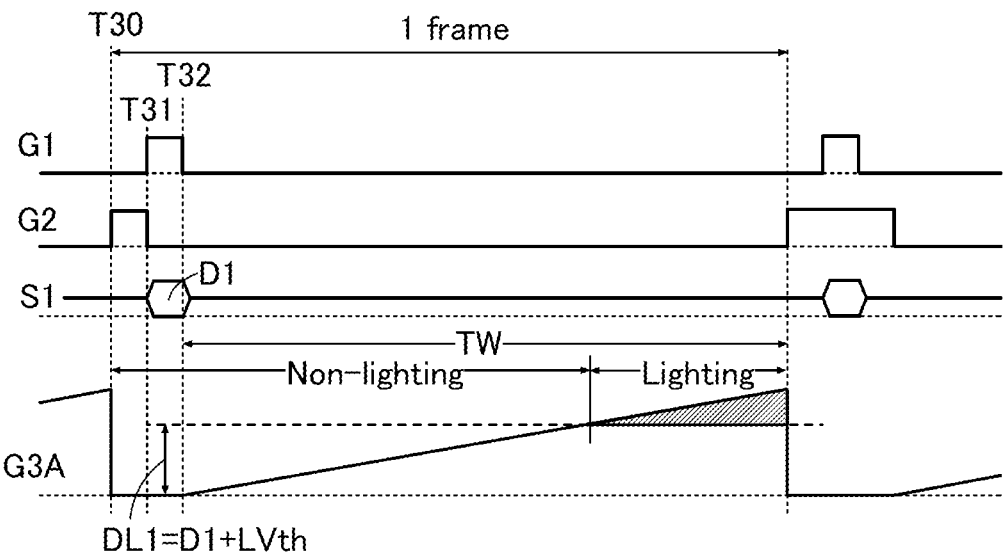

FIG. 4(B) is a timing chart illustrating an example of the operation of the pixel 10A.

At Time T30, the reset signal is input to the wiring G2. The reset signal is input to the gate of the transistor 32 through the wiring G2, and the light-emitting element is turned off. The transistor 32 is set in an on state, and the potential retained in the capacitor 34 is initialized. In addition, at Time T30, the triangle wave TW input to the wiring G3A is initialized.

At Time T31, the reset signal input to the wiring G2 is canceled, and the transistor 32 is set in an off state. In addition, at Time T31, the wiring G1 is set in a selected state by a scan signal input to the wiring G1. The transistor 33 is set in an on state, and the display data D1 input to the wiring S1 is input to the capacitor 34. The display data D1 input to the capacitor 34 is input to the gate of the transistor 31.

At Time T32, the scan signal input to the wiring G1 is set in a non-selected state. Thus, the transistor 33 is set in an off state, and the display data D1 input to the capacitor 34 is retained. Then, the triangle wave TW is preferably input to the wiring G3A. The transistor 31 supplies current to the light-emitting element corresponding to the first potential and the light-emitting element starts to be turned on. Note that when the potential of the triangle wave TW that is applied to the anode terminal of the light-emitting element becomes higher than a potential DL1 obtained by addition of the threshold voltage LVth of the light-emitting element to the display data D1, the light-emitting element starts to be turned on.

FIG. 4(B) illustrates an example in which the light-emitting element is turned on during a period indicated by a hatched pattern. Furthermore, the emission intensity of the light-emitting element is preferably increased in accordance with the change in the triangle wave TW. Note that in the pixel 10A, a period during which the triangle wave TW is input is preferably shorter than one frame.

Figures 5A, 5B:
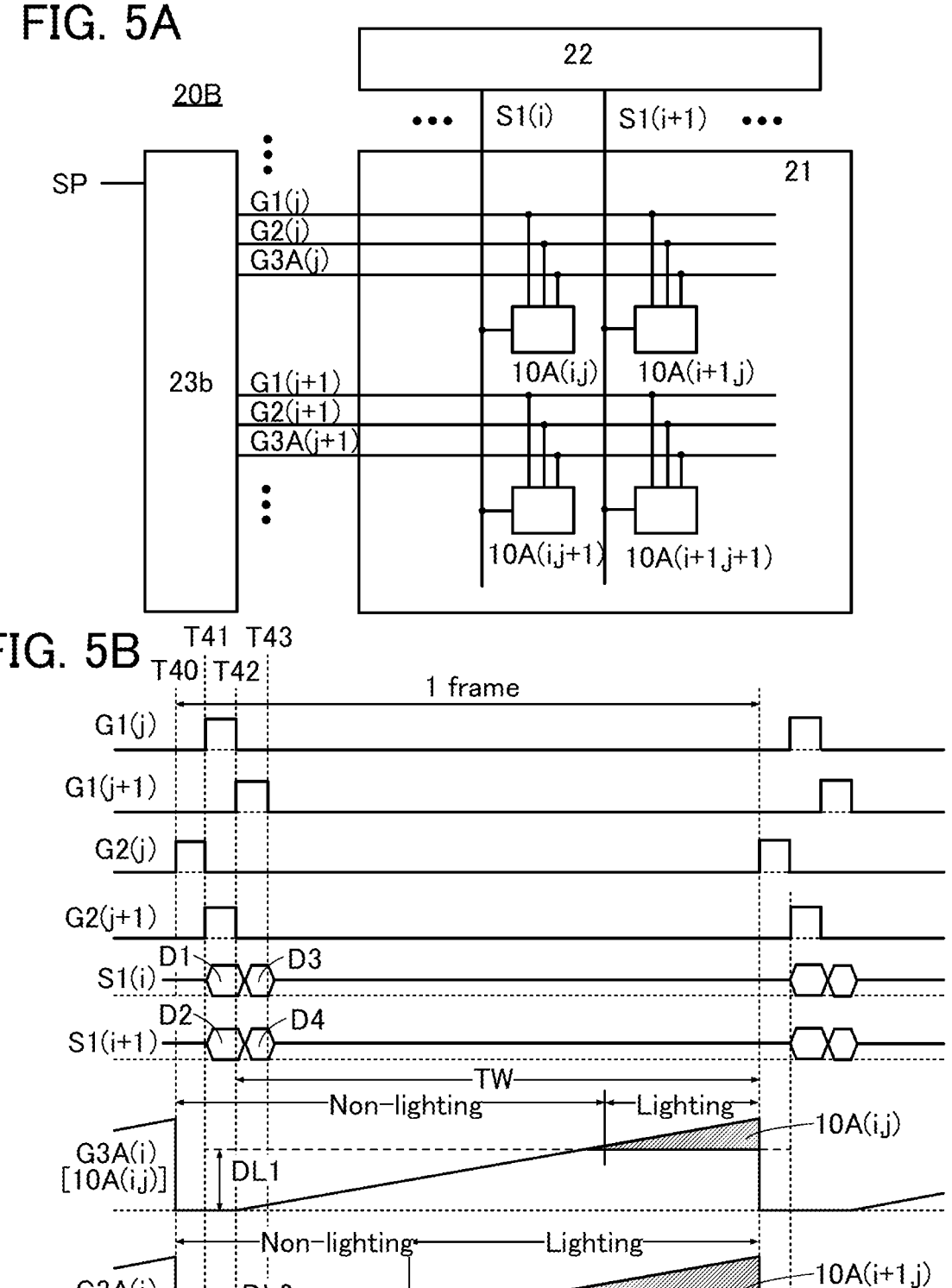
FIG. 5 (A) A block diagram illustrating a display device, and (B) a timing chart illustrating operation of the display device.

FIG. 5(A) is a block diagram illustrating a display device 20B. The display device 20B includes the display region 21, the source driver 22, and a gate driver 23b. The display region 21 includes a pixel 10A(1,1) to a pixel 10A(m,n). For example, FIG. 5(A) illustrates a pixel 10A(i,j) to a pixel 10A(i+1,j+1). "m" and "n" are each a positive integer, "i" is an integer greater than or equal to 1 and less than or equal to m, and "j" is an integer greater than or equal to 1 and less than or equal to n.

For example, connection between the pixel 10A(i,j) and wirings is described. The pixel 10A(i,j) is electrically connected to the gate driver 23b through the wiring G1(j), the wiring G2(j), or a wiring G3A(j). The pixel 10A(i,j) is electrically connected to the source driver 22 through the wiring S1(i).

FIG. 5(B) is a timing chart illustrating an example of the operation of the display device. The description of the detailed operation of the pixel 10A is omitted because the description in FIG. 4(B) can be referred to.

At Time T40, a reset signal is input to the wiring G2(j), retained potentials of the pixel 10A(i,j) and a pixel 10A(i+1,j) are initialized, and the light-emitting elements are turned off In addition, the triangle wave TW input to the wiring G3A(j) is initialized.

At Time T41, the reset signal input to the wiring G2(j) is canceled. In addition, at Time T41, the wiring G1(j) is set in a selected state by a scan signal input to the wiring G1(j). The display data D1 is input to the wiring S1(i), and the display data D2 is input to the wiring S1(i+1).

In addition, at Time T41, a reset signal is input to the wiring G2(j+1), retained potentials of the pixel 10A(i,j) and the pixel 10A(i+1,j) are initialized, and the light-emitting elements are turned off. Furthermore, the triangle wave TW input to a wiring G3A(j+1) is initialized.

At Time T42, the scan signal input to the wiring G1(i) is set in a non-selected state. Therefore, the display data D1 is retained in the pixel 10A(i,j), and the display data D2 is retained in the pixel 10A(i+1,j).

Then, the triangle wave TW is preferably input to the wiring G3A(j). In the pixel 10A(i,j), current corresponding to the display data D1 is supplied to the light-emitting element, and the light-emitting element starts to be turned on. Note that when the potential of the triangle wave TW that is applied to the anode terminal of the light-emitting element becomes higher than the potential DL1 obtained by addition of the threshold voltage LVth of the light-emitting element to the display data D1, the light-emitting element starts to be turned on. Similarly, in the pixel 10A(i+1,j), current corresponding to the display data D2 is supplied to the light-emitting element, and the light-emitting element starts to be turned on.

At Time T43, the scan signal input to the wiring G1(j+1) is set in a non-selected state. Therefore, the display data D3 is retained in a pixel 10A(i,j+1), and the display data D4 is retained in a pixel 10A(i+1,j+1).

Then, the triangle wave TW is preferably input to the wiring G3A(j+1). In the pixel 10A(i,j+1), current corresponding to the display data D3 is supplied to the light-emitting element, and the light-emitting element starts to be turned on. Note that when the potential of the triangle wave TW that is applied to the anode terminal of the light-emitting element becomes higher than a potential DL3 obtained by addition of the threshold voltage LVth of the light-emitting element to the display data D3, the light-emitting element starts to be turned on. Similarly, in the pixel 10A(i+1,j+1), current corresponding to the display data D4 is supplied to the light-emitting element, and the light-emitting element starts to be turned on. The description of subsequent operations is omitted because similar processings are repeated.

In the timing chart illustrated in FIG. 5(B), the triangle wave TW is input to the wiring G3A(j) or the wiring G3A(j+1) in response to each scan signal input to the wiring G1(j) or the wiring G1(j+1). The lighting period differs depending on a selected row, so that the lighting times of the light-emitting elements vary. Thus, the concentration of power consumption due to lighting of the light-emitting elements can be dispersed.

Figure 6A:
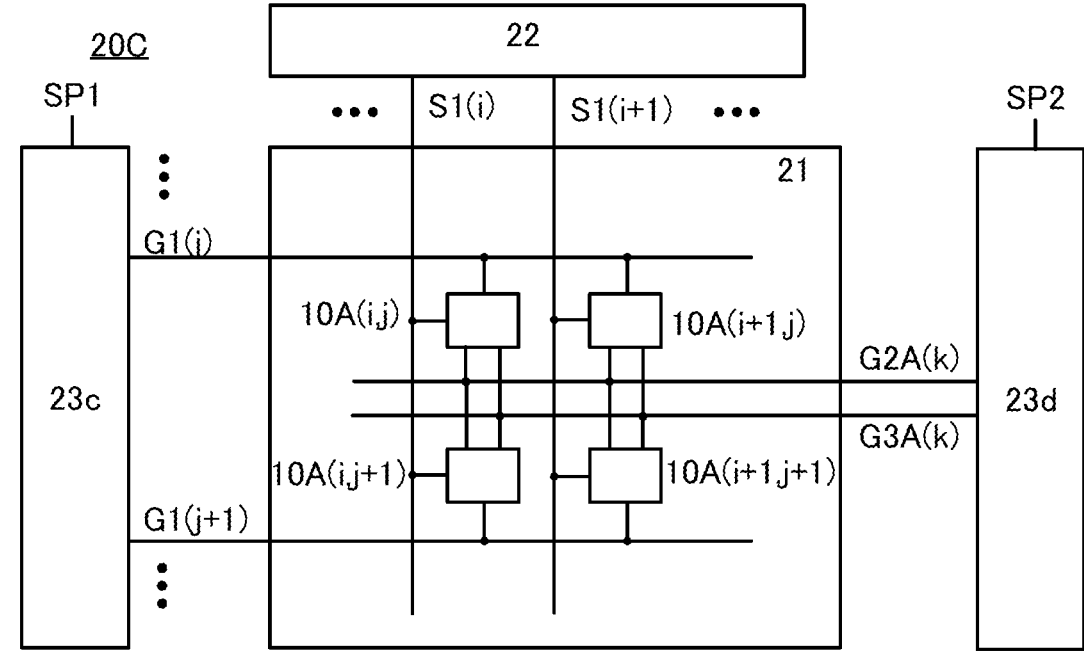
FIG. 6 (A) A block diagram illustrating a display device, and (B) a timing chart illustrating operation of the display device.

FIG. 6(A) is a block diagram illustrating a display device 20C. The display device 20C includes the display region 21, the source driver 22, a gate driver 23c, and a gate driver 23d. The display region 21 includes the pixel 10A(1,1) to the pixel 10A(m,n). For example, FIG. 6(A) illustrates the pixel 10A(i,j) to the pixel 10A(i+1,j+1). "m" and "n" are each a positive integer, "i" is an integer greater than or equal to 1 and less than or equal to m, and "j" is an integer greater than or equal to 1 and less than or equal to n.

For example, connection between the pixel 10A(i,j) and wirings is described. The pixel 10A(i,j) is electrically connected to the gate driver 23c through the wiring G1(j). The pixel 10A(i,j) is also electrically connected to the gate driver 23d through a wiring G2A(k) or a wiring G3A(k). The pixel 10A(i,j) can share the wiring G2A(k) and the wiring G3A(k) with a pixel in an adjacent row, for example, the pixel 10A(i,j+1). FIG. 6(A) illustrates an example in which pixels connected to the wiring G1(i) and the wiring G1(j+1) share the wiring G2A(k) and the wiring G3A(k). Note that the pixels that can share the wiring G2A(k) and the wiring G3A(k) are not limited to adjacent pixels connected to the wiring G1. Pixels connected to a plurality of wirings G1 can share the wiring G2A(k) and the wiring G3A(k).

A reset signal is input to the wiring G2A(k), and a triangle wave is input to the wiring G3A(k). Note that the pixel 10A(i,j) and the pixel 10A(i,j+1) are electrically connected to the source driver 22 through the wiring S1(i). Note that k is a positive integer greater than or equal to 1 and less than or equal to j.

Figure 6B:
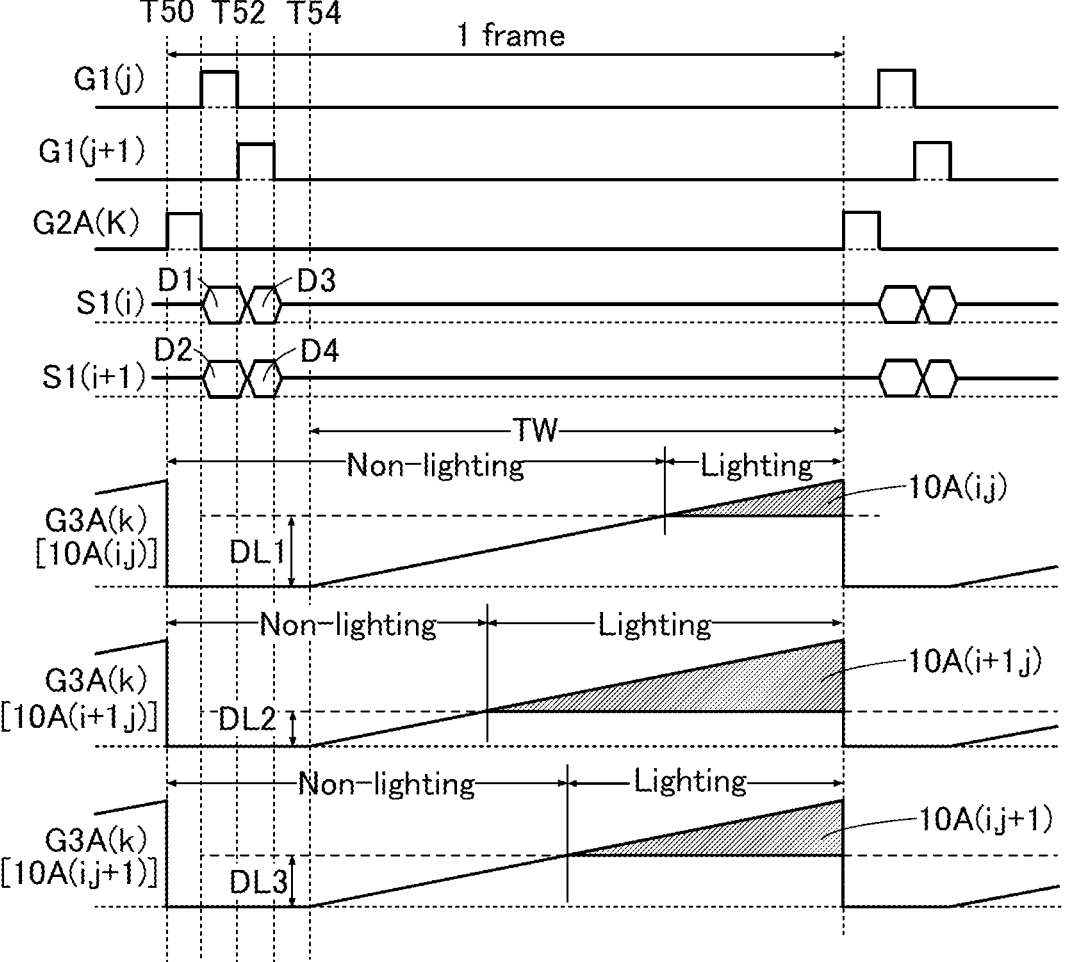

FIG. 6(B) is a timing chart illustrating an example of the operation of the display device 20C. The description of the detailed operation of the pixel 10A is omitted because the description in FIG. 4(B) can be referred to.

At Time T50, a reset signal is input to the wiring G2A(k), retained potentials of the pixel 10A(i,j) and the pixel 10A(i+1,j) are initialized, and the light-emitting elements are turned off. In addition, the triangle wave TW input to the wiring G3A(j) is initialized.

At Time T51, the reset signal input to the wiring G2A(k) is canceled. In addition, at Time T51, the wiring G1(j) is set in a selected state by a scan signal input to the wiring G1(j). The display data D1 is input to the wiring S1(i), and the display data D2 is input to the wiring S1(i+1).

At Time T52, the scan signal input to the wiring G1(i) is set in a non-selected state. Therefore, the display data D1 is retained in the pixel 10A(i,j), and the display data D2 is retained in the pixel 10A(i+1,j).

At Time T52, the wiring G1(j+1) is set in a selected state by a scan signal input to the wiring G1(j+1). The display data D3 is input to the wiring S1(i), and the display data D4 is input to the wiring S1(i+1).

In addition, at Time T53, the scan signal input to the wiring G1(j+1) is set in a non-selected state. Therefore, the display data D3 is retained in the pixel 10A(i,j+1), and the display data D4 is retained in the pixel 10A(i+1,j+1).

At Time T54, the triangle wave TW is preferably input to the wiring G3A(k). In the pixel 10A(i,j), current corresponding to the display data D1 is supplied to the light-emitting element, and the light-emitting element starts to be turned on. Note that when the potential of the triangle wave TW that is applied to the anode terminal of the light-emitting element becomes higher than the potential DL1 obtained by addition of the threshold voltage LVth of the light-emitting element to the display data D1, the light-emitting element starts to be turned on. Similarly, in the pixel 10A(i+1,j), the pixel 10A(i,j+1), and the pixel 10A(i+1,j+1), currents corresponding to the display data D2, the display data D3, and the display data D4, respectively, are supplied to the light-emitting elements, and the light-emitting elements start to be turned on.

In the timing chart illustrated in FIG. 5(B), the triangle wave TW is input to each wiring G3A(k) in response to each scan signal input to the wiring G1(i) or the wiring G1(j+1). The cost of the gate driver 23d can be reduced by a reduction in the number of wirings. In addition, the lighting periods differ among a plurality of selected rows, so that the lighting times of the light-emitting elements vary. Thus, the concentration of power consumption due to lighting of the light-emitting elements can be dispersed.

The structure and method described in this embodiment can be used in appropriate combination with the structures and methods described in the other embodiments.

Embodiment 3

In this embodiment, details of the example of a display device described in the above embodiment will be described.

Structure Example

Figures 7A, 7B, 7C:
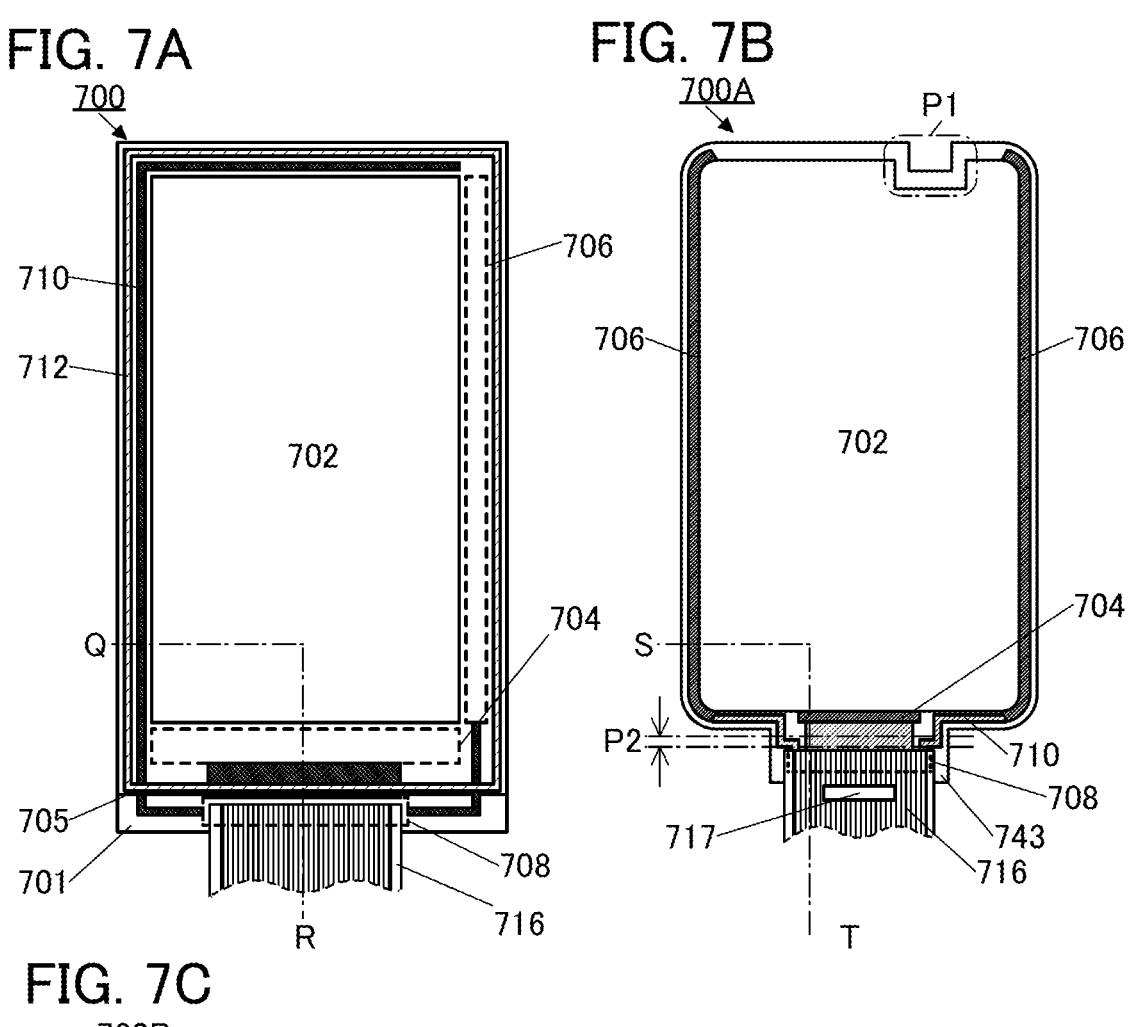
FIG. 7 (A) to (C) Top views of display devices.

FIG. 7(A) is a top view of a display device 700. The display device 700 includes a first substrate 701 and a second substrate 705 that are attached to each other with a sealant 712. In addition, in a region sealed with the first substrate 701, the second substrate 705, and the sealant 712, a pixel portion 702, a source driver circuit portion 704, and a gate driver circuit portion 706 are provided over the first substrate 701. Furthermore, a plurality of display elements are provided in the pixel portion 702.

In addition, an FPC terminal portion 708 to which an FPC 716 (FPC: Flexible printed circuit) is connected is provided in a portion of the first substrate 701 that does not overlap with the second substrate 705. The pixel portion 702, the source driver circuit portion 704, and the gate driver circuit portion 706 are each supplied with a variety of signals and the like from the FPC 716 through the FPC terminal portion 708 and a signal line 710.

A plurality of gate driver circuit portions 706 may be provided. Alternatively, the gate driver circuit portion 706 and the source driver circuit portion 704 may be formed separately on semiconductor substrates or the like to obtain packaged IC chips. The IC chips can each be mounted on the first substrate 701 or the FPC 716.

The structures of transistors included in the pixel portion 702, the source driver circuit portion 704, and the gate driver circuit portion 706 are not particularly limited. For a semiconductor layer of the transistor, a single crystal semiconductor, a polycrystalline semiconductor, a microcrystalline semiconductor, an amorphous semiconductor, or the like can be used alone or can be used in combination. As a semiconductor material, silicon, germanium, or the like can be used, for example. Alternatively, a compound semiconductor such as silicon germanium, silicon carbide, gallium arsenide, an oxide semiconductor, or a nitride semiconductor, an organic semiconductor, or the like can be used.

In the case of using an organic semiconductor for the semiconductor layer, a low molecular organic material having an aromatic ring, a $\pi$-electron conjugated conductive polymer, or the like can be used. For example, rubrene, tetracene, pentacene, perylenediimide, tetracyanoquinodimethane, polythiophene, polyacetylene, polyparaphenylene vinylene, or the like can be used.

The transistor used in this embodiment preferably includes a highly purified oxide semiconductor film in which formation of oxygen vacancies is suppressed. The transistor can have low off-state current. Thus, the retention time of an electric signal such as an image signal can be made long. Accordingly, the frequency of refresh operations can be reduced, resulting in an effect of reducing power consumption.

In addition, the transistor used in this embodiment can have comparatively high field-effect mobility and thus is capable of high-speed operation. For example, with such a transistor capable of high-speed operation used for a display device, a switching transistor in a pixel portion and a driver transistor used in a driver circuit portion can be formed over the same substrate. That is, a structure in which a driver circuit formed using a silicon wafer or the like is not used is possible, in which case the number of components of a semiconductor device can be reduced. Moreover, the use of the transistor capable of high-speed operation also in the pixel portion can provide a high-quality image.

A display device 700A illustrated in FIG. 7(B) is an example of a display device that includes a flexible resin layer 743 instead of the first substrate 701 and can be used as a flexible display.

In the display device 700A, the pixel portion 702 does not have a rectangular shape but has arc-shaped corner portions. The display device 700A includes a notch portion in which part of the pixel portion 702 and part of the resin layer 743 are cut as shown in a region P1 in FIG. 7(B). A pair of gate driver circuit portions 706 is provided on opposite sides with the pixel portion 702 therebetween. In addition, the gate driver circuit portions 706 are provided along an arc-shaped outline at the corners of the pixel portion 702.

The resin layer 743 has a protrusion where the FPC terminal portion 708 is provided. Furthermore, part of the resin layer 743 that includes the FPC terminal portion 708 can be bent backward in a region P2 in FIG. 7(B). When part of the resin layer 743 is bent backward, the display device 700A can be mounted on an electrical device while the FPC 716 overlaps with a back side of the pixel portion 702; thus, an electronic device can be downsized.

In addition, an IC 717 is mounted on the FPC 716 connected to the display device 700A. The IC 717 has a function of a source driver circuit, for example. In this case, a structure can be employed in which the source driver circuit portion 704 in the display device 700A includes at least one of a protection circuit, a buffer circuit, a demulti-plexer circuit, and the like.

A display device 700B illustrated in FIG. 7(C) is a display device that can be suitably used for an electronic device with a large screen. For example, the display device 700B can be suitably used for a television device, a monitor device, a personal computer (including a laptop type or a desktop type), a tablet terminal, digital signage, or the like.

The display device 700B includes a plurality of source driver ICs 721 and a pair of gate driver circuit portions 722.

The plurality of source driver ICs 721 are attached to respective FPCs 723. In addition, in each of the plurality of FPCs 723, one terminal is connected to the substrate 701, and the other terminal is connected to a printed circuit board 724. By bending the FPCs 723, the printed circuit board 724 can be placed on the back side of the pixel portion 702 so that the display device 700B can be mounted on an electrical device; thus, an electronic device can be downsized.

In contrast, the gate driver circuit portions 722 are provided over the substrate 701. Thus, an electronic device with a narrow bezel can be achieved.

With such a structure, a large high-resolution display device can be achieved. For example, such a structure can also be employed in a display device with a screen diagonal of 30 inches or more, 40 inches or more, 50 inches or more, or 60 inches or more. Furthermore, a display device with extremely high resolution such as 4K2K or 8K4K can be achieved.

Cross-Sectional Structure Example 1

Figure 8:
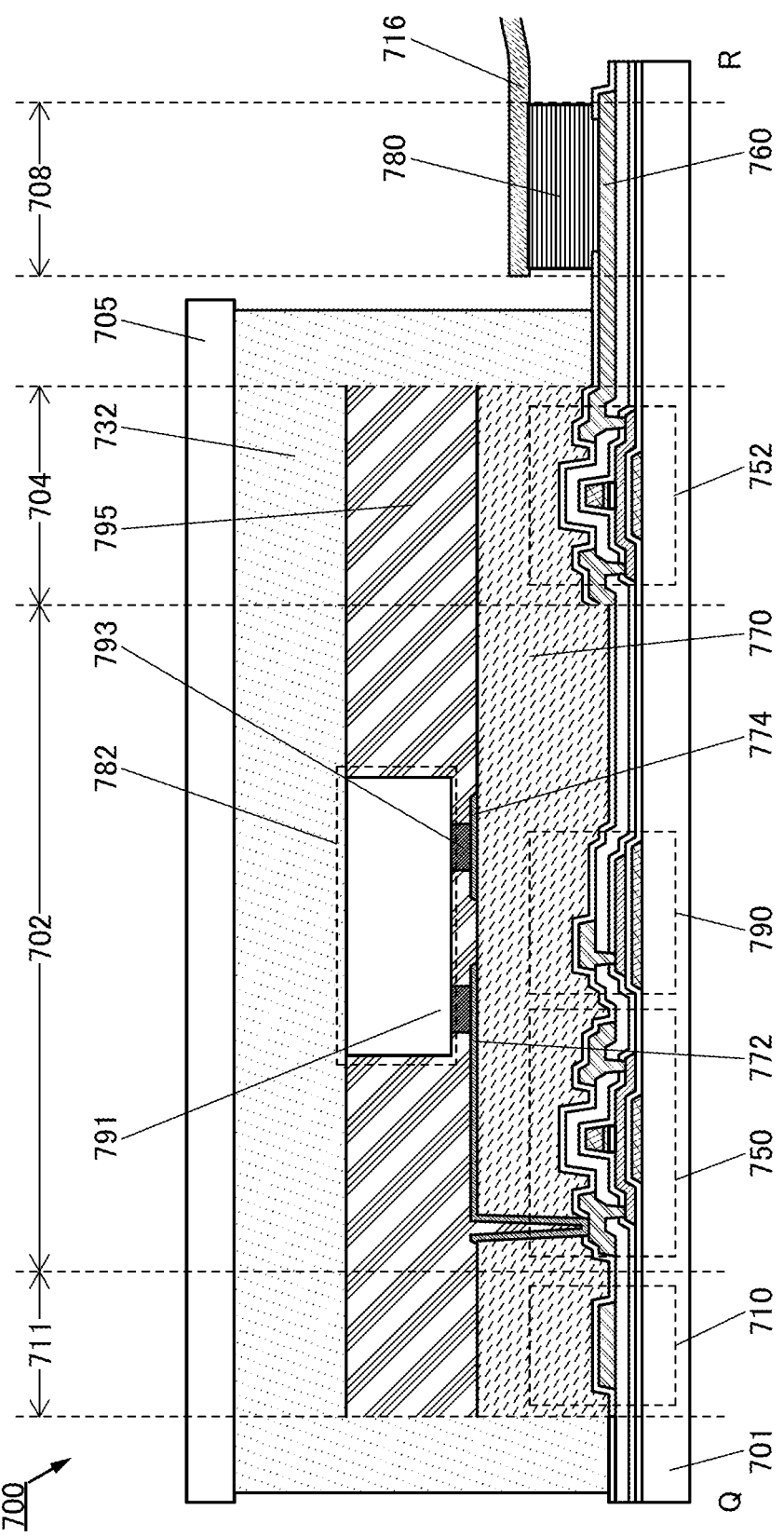
FIG. 8 A cross-sectional view of the display device.

FIG. 8 is a cross-sectional view taken along dashed-dotted line Q-R in FIG. 7(A).

The display device illustrated in FIG. 8 includes a lead wiring portion 711, the pixel portion 702, the source driver circuit portion 704, and the FPC terminal portion 708. The lead wiring portion 711 includes the signal line 710. The pixel portion 702 includes a transistor 750 and a capacitor 790. The source driver circuit portion 704 includes a transistor 752.

The capacitor 790 illustrated in FIG. 8 includes a lower electrode formed by processing the same film as a first gate electrode of the transistor 750 and an upper electrode formed by processing the same metal oxide as a semiconductor layer. The upper electrode has reduced resistance like a source region and a drain region of the transistor 750. In addition, part of an insulating film functioning as a first gate insulating layer of the transistor 750 is provided between the lower electrode and the upper electrode. That is, the capaci-tor 790 has a stacked-layer structure in which an insulating film functioning as a dielectric film is positioned between a pair of electrodes. Furthermore, a wiring obtained by pro-cessing the same film as a source electrode and a drain electrode of the transistor is connected to the upper elec-trode.

In addition, an insulating layer 770 that has a planariza-tion function is provided over the transistor 750, the tran-sistor 752, and the capacitor 790. With the insulating layer 770, top surfaces of a conductive layer 772 and a conductive layer 774 that are provided over the insulating layer 770 can be made flat. The conductive layer 772 and the conductive layer 774 are positioned on the same plane and the top surfaces of the conductive layer 772 and the conductive layer 774 are flat; therefore, the conductive layer 772 and the conductive layer 774 can be electrically connected to a light-emitting element 782 easily.

Here, the light-emitting element 782 is described. For example, the light-emitting element 782 is preferably capable of emitting light with a plurality of different hues. Alternatively, it is possible to combine a plurality of light-emitting elements 782 that emit lights with different single colors. Alternatively, a structure may be employed in which a light-blocking layer is provided on the second substrate 705 side. When a light-blocking layer is provided, a viewing angle can be limited. Alternatively, a light-blocking layer and a coloring layer can also be provided on the second substrate 705 side. Note that when a light-blocking layer and a coloring layer are provided on the second substrate 705 side, the light-emitting element 782 that emits white light can be used.

As the transistor 750 included in the pixel portion 702 and the transistor 752 included in the source driver circuit portion 704, transistors having different structures may be used. For example, a structure may be employed in which a top-gate transistor is used as one of the transistors 750 and 752 and a bottom-gate transistor is used as the other of the transistors 750 and 752. Note that the gate driver circuit portion 706 is similar to the source driver circuit portion 704.

The signal line 710 is formed using the same conductive film as the source electrodes, the drain electrodes, and the like of the transistors 750 and 752. In this case, a low-resistance material such as a material containing a copper element is preferably used because signal delay or the like due to wiring resistance can be reduced and display on a large screen is possible.

The FPC terminal portion 708 includes a wiring 760 part of which functions as a connection electrode, an anisotropic conductive film 780, and the FPC 716. The wiring 760 is electrically connected to a terminal included in the FPC 716 through the anisotropic conductive film 780. Here, the wiring 760 is formed using the same conductive film as the source electrodes, the drain electrodes, and the like of the transistors 750 and 752.

As the first substrate 701 and the second substrate 705, a glass substrate or a flexible substrate such as a plastic substrate can be used, for example. In the case where a flexible substrate is used as the first substrate 701, an insulating layer having a barrier property against water or hydrogen is preferably provided between the first substrate 701 and the transistor 750 and the like.

Next, an example of a method for manufacturing the display device 700 illustrated in FIG. 8 will be described. FIG. 9 to FIG. 11 are schematic cross-sectional views each illustrating a stage of steps in the method for manufacturing the display device 700.

Note that thin films that constitute the display device (insulating films, semiconductor films, conductive films, and the like) can be formed by a sputtering method, a chemical vapor deposition (CVD) method, a vacuum evaporation method, a pulsed laser deposition (PLD) method, an atomic layer deposition (ALD) method, or the like. As the CVD method, a plasma-enhanced chemical vapor deposition (PECVD) method or a thermal CVD method may be used. As the thermal CVD method, for example, a metal organic chemical vapor deposition (MOCVD: Metal Organic CVD) method may be used.

Alternatively, the thin films that constitute the display device (insulating films, semiconductor films, conductive films, and the like) can be formed by a method such as spin coating, dipping, spray coating, ink-jetting, dispensing, screen printing, or offset printing, or with a tool (equipment) such as a doctor knife, a slit coater, a roll coater, a curtain coater, or a knife coater.

In addition, when the thin films that constitute the display device are processed, a photolithography method or the like can be used for the processing. Alternatively, island-shaped thin films may be formed by a deposition method using a blocking mask. Alternatively, the thin films may be processed by a nanoimprinting method, a sandblasting method, a lift-off method, or the like. The following two examples of a photolithography method can be given. One is a method in which a resist mask is formed by applying a photosensitive resist material onto a thin film that is to be processed, exposing the photosensitive resist material to light through a photomask, and then performing development, and the thin film is processed by etching or the like, so that the resist mask is removed. The other is a method in which, after a photosensitive thin film is deposited, exposure and development are performed, so that the thin film is processed into a desired shape.

For light used for exposure in a photolithography method, for example, an i-line (with a wavelength of 365 nm), a g-line (with a wavelength of 436 nm), an h-line (with a wavelength of 405 nm), or light in which these lines are mixed can be used. Besides, ultraviolet light, KrF laser light, ArF laser light, or the like can be used. Furthermore, exposure may be performed by liquid immersion exposure technique. Furthermore, as the light used for the exposure, extreme ultra-violet (EUV) light or X-rays may be used. Moreover, instead of the light used for the exposure, an electron beam can also be used. It is preferable to use extreme ultra-violet light, X-rays, or an electron beam because extremely minute processing can be performed. Note that in the case of performing exposure by scanning of a beam such as an electron beam, a photomask is not needed.

For etching of the thin film, a dry etching method, a wet etching method, a sandblast method, or the like can be used.
<Formation of Transistor and the Like>

First, a conductive layer 301, a conductive layer 303, and a conductive layer 305 are formed over the substrate 701. The conductive layer 301, the conductive layer 303, and the conductive layer 305 can be formed by depositing a conductive film, forming a resist mask, etching the conductive film, and then removing the resist mask.

Then, an insulating layer 311 is formed to cover the substrate 701, the conductive layer 301, the conductive layer 303, and the conductive layer 305.

Figures 9A, 9B, 9C:
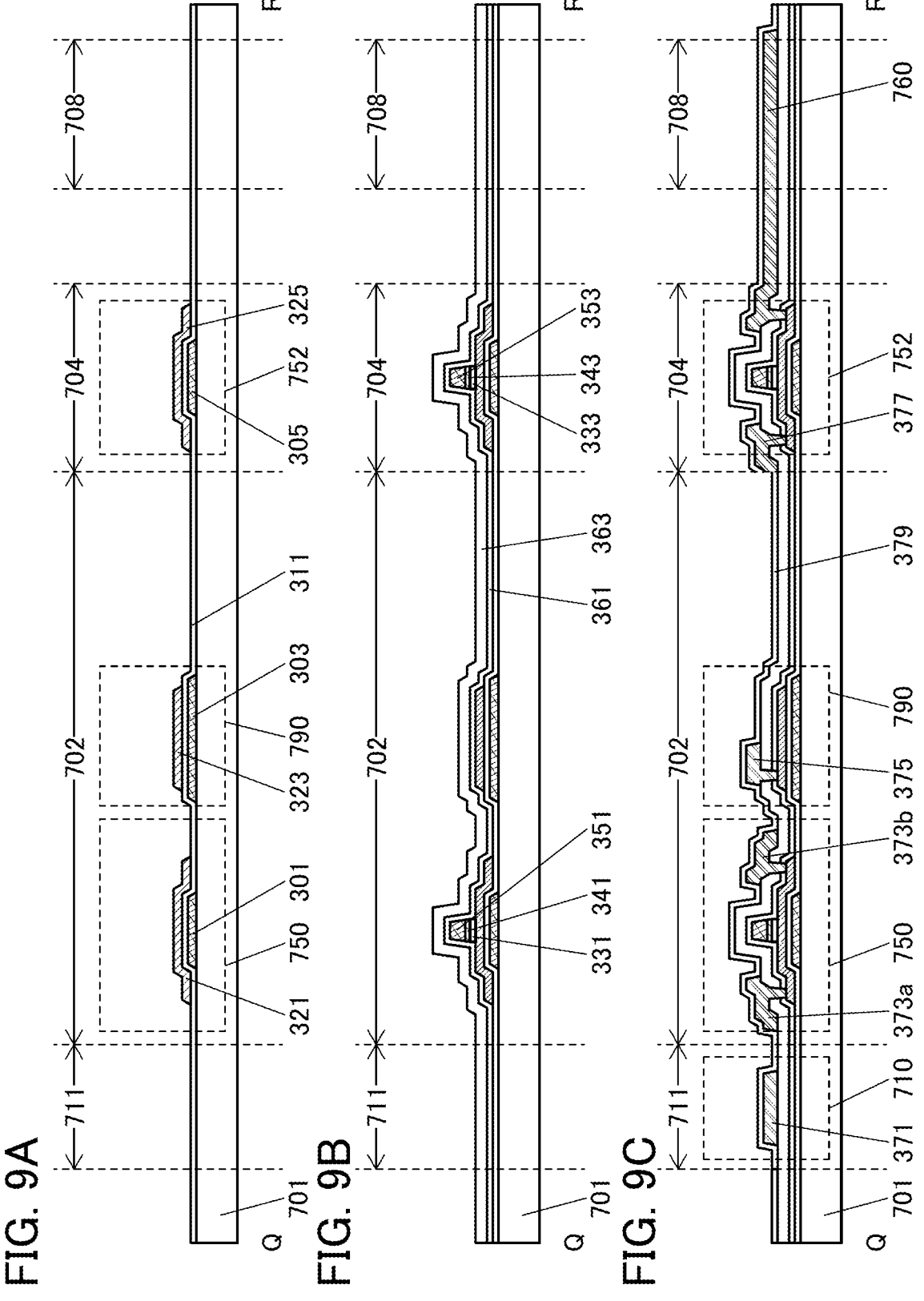
FIG. 9 (A) to (C) Diagrams illustrating a method for manufacturing a display device.

Next, a semiconductor layer 321, a semiconductor layer 323, and a semiconductor layer 325 are formed (FIG. 9(A)). The semiconductor layer 321, the semiconductor layer 323, and the semiconductor layer 325 can be formed by depositing a semiconductor film, forming a resist mask, etching the semiconductor film, and then removing the resist mask.

Then, an insulating layer 331, a conductive layer 341, a conductive layer 351, an insulating layer 333, a conductive layer 343, and a conductive layer 353 are formed. The insulating layer 331, the conductive layer 341, the conductive layer 351, the insulating layer 333, the conductive layer 343, and the conductive layer 353 can be formed by forming an insulating film that serves as the insulating layer 331 and the insulating layer 333, a conductive film that serves as the conductive layer 341 and the conductive layer 343, and a conductive film that serves as the conductive layer 351 and the conductive layer 353, forming a resist mask, etching the insulating film and the conductive films, and then removing the resist mask.

Next, an insulating layer 361 and an insulating layer 363 are formed (FIG. 9(B)).

After that, openings are formed in the insulating layer 361 and the insulating layer 363, and a conductive layer 371, a conductive layer 373a, a conductive layer 373b, a conductive layer 375, a conductive layer 377, and the wiring 760 are formed. The conductive layer 371, the conductive layer 373a, the conductive layer 373b, the conductive layer 375, the conductive layer 377, and the wiring 760 can be formed by methods similar to those for the conductive layer 301 and the like.

Through the above steps, the signal line 710, the transistor 750, the capacitor 790, and the transistor 752 can be formed (FIG. 9(C)). Next, an insulating layer 379 is formed. The insulating layer 379 has a function of a protective film for the transistor 750 and the like.
<Formation of Insulating Layer 770>

Next, the insulating layer 770 is formed. When a photosensitive material is used for the insulating layer 770, an opening can be formed by a photolithography method or the like. Note that the opening may be formed by depositing an insulating film for the insulating layer 770 and then etching part of the insulating film with the use of a resist mask. It is preferable to use an organic insulating material for the insulating layer 770 because the flatness of the top surface thereof can be increased.

Alternatively, an inorganic insulating film may be used for the insulating layer 770. The insulating layer 770 can be formed using a single layer of an inorganic insulating material such as silicon nitride, silicon oxide, silicon oxynitride, silicon nitride oxide, aluminum oxide, aluminum nitride, aluminum oxynitride, or aluminum nitride oxide, or a stack thereof Thus, the insulating layer 770 functions as a protective layer for the transistor 750 and the like.

Alternatively, the insulating layer 770 may have a stacked structure of an inorganic insulating film and an organic insulating film.

Then, part of the insulating layer 379 over the wiring 760 in the FPC terminal portion 708 is removed so that the wiring 760 is exposed.
<Formation of Conductive Layer 772 and Conductive Layer 774>

Figures 10A, 10B:
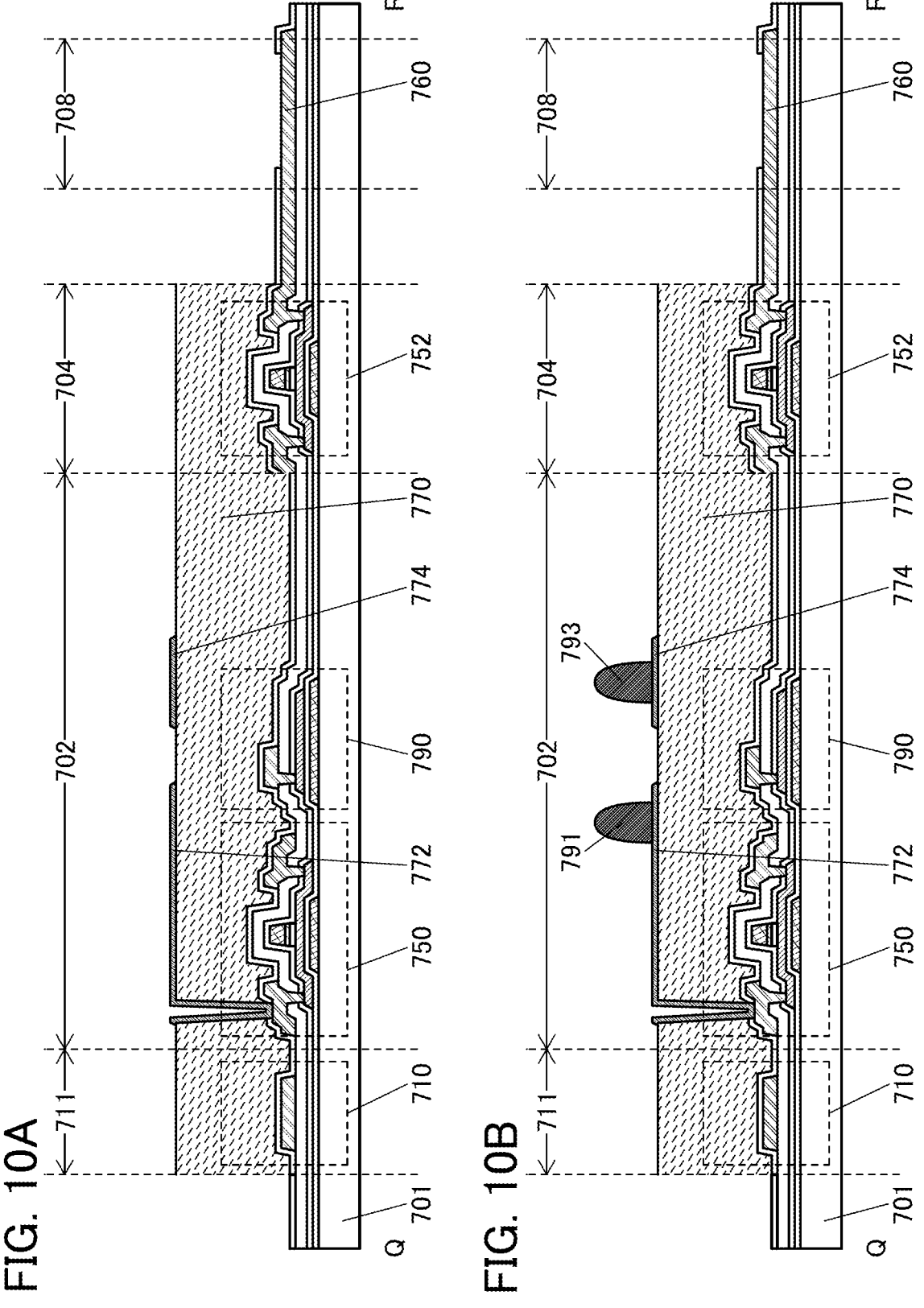
FIG. 10 (A) to (B) Diagrams illustrating a method for manufacturing a display device.

Next, the conductive layer 772 and the conductive layer 774 are formed over the insulating layer 770 (FIG. 10(A)). The conductive layer 772 is electrically connected to the transistor 750 through the opening of the insulating layer 770. The conductive layer 772 and the conductive layer 774 can be formed by a method similar to that of the conductive layer 301 or the like. It is preferable to use a visible-light reflective material for the conductive layer 772 and the conductive layer 774. For example, an alloy of silver, palladium, and copper (also referred to as APC) or a material containing aluminum, titanium, copper, or the like can be used for the conductive layer 772 and the conductive layer 774.

Then, a conductive bump 791 and a bump 793 are formed over the conductive layer 772 and the conductive layer 774, respectively (FIG. 10(B)). A metal such as gold, silver, or tin, an alloy containing these metals, an anisotropic conductive film made of a conductive resin or the like, or conductive paste can be used for the bump 791 and the bump 793. For example, gold can be favorably used for the bump 791 and the bump 793. For formation of the bump 791 and the bump 793, a printing method, a transfer method, a discharge method, or the like can be used.

<Placement of Light-Emitting Element 782>

Next, the light-emitting element 782 is placed over the bump 791 and the bump 793. For the placement, the light-emitting element 782 is placed so that a cathode-side electrode and an anode-side electrode of the light-emitting element 782 are in contact with the bump 791 and the bump 793, respectively. The bump 791, the bump 793, the light-emitting element 782, the conductive layer 772, and the conductive layer 774 are subjected to pressure welding, so that the light-emitting element 782 is fixed onto the conductive layer 772 and the conductive layer 774. Moreover, the conductive layer 772 and the conductive layer 774 are electrically connected to the light-emitting element 782 (FIG. 11).

For the placement of the light-emitting element 782, a pick-and-place device can be used. Alternatively, for the placement of the light-emitting element 782, an FSA (Fluidic Self Assembly) method may be used. In the FSA method, a concave insulating layer that fits the light-emitting element 782 is formed over the conductive layer 772 and in a region overlapping with the conductive layer 774, and the light-emitting element 782 is placed in a concave portion in liquid in a self-aligning manner.

<Attachment of Substrate 701 and Substrate 705>

Next, a bonding layer for bonding the substrate 701 and the substrate 705 is formed on any one of the substrate 701 and the substrate 705 or both of them. The bonding layer is formed to surround a region where a pixel is placed. The bonding layer can be formed by a screen printing method, a dispensing method, or the like. A heat curable resin, an ultraviolet curable resin, or the like can be used for the bonding layer. Alternatively, a resin that is cured when heated after pre-cured by ultraviolet light, or the like may be used. Alternatively, a thermosetting and ultraviolet curable resin or the like may be used for the bonding layer.

After that, the substrate 701 and the substrate 705 are attached to each other, and a sealing film 732 is formed by hardening of the bonding layer. The attachment is preferably performed in a reduced-pressure atmosphere because air bubbles and the like can be prevented from entering a region between the substrate 701 and the substrate 705.

Then, the anisotropic conductive film 780 is provided over the wiring 760. The FPC 716 is placed over the anisotropic conductive film 780 and is subjected to thermocompression, so that the wiring 760 and the FPC 716 are electrically connected to each other.

Through the above steps, the display device 700 can be formed (FIG. 8).

The structure and method described in this embodiment can be used in appropriate combination with the structures and methods described in the other embodiments.

Embodiment 4

In this embodiment, examples of a transistor that can be used for the display device described in the above embodiment will be described.

The display device of one embodiment of the present invention can be manufactured using a transistor with various modes, such as a bottom-gate transistor or a top-gate transistor. Therefore, a material used for a semiconductor layer or a transistor structure can be easily changed depending on the existing manufacturing line.

<Bottom-Gate Transistor>

FIG. 12(A1) is a cross-sectional view in the channel length direction of a channel protective transistor 1810 that is a kind of bottom-gate transistor. In FIG. 12(A1), the transistor 1810 is formed over a substrate 1771. In addition, the transistor 1810 includes an electrode 1746 over the substrate 1771 with an insulating layer 1772 therebetween. The transistor 1810 further includes a semiconductor layer 1742 over the electrode 1746 with an insulating layer 1726 therebetween. The electrode 1746 can function as a gate electrode. The insulating layer 1726 can function as a gate insulating layer.

The transistor 1810 further includes an insulating layer 1741 over a channel formation region in the semiconductor layer 1742. The transistor 1810 further includes an electrode 1744*a* and an electrode 1744*b* that are partly in contact with the semiconductor layer 1742 and are over the insulating layer 1726. The electrode 1744*a* can function as one of a source electrode and a drain electrode. The electrode 1744*b* can function as the other of the source electrode and the drain electrode. Part of the electrode 1744*a* and part of the electrode 1744*b* are formed over the insulating layer 1741.

The insulating layer 1741 can function as a channel protective layer. With the insulating layer 1741 provided over the channel formation region, the semiconductor layer 1742 can be prevented from being exposed at the time of forming the electrode 1744*a* and the electrode 1744*b*. Thus, the channel formation region in the semiconductor layer 1742 can be prevented from being etched at the time of forming the electrode 1744*a* and the electrode 1744*b*. According to one embodiment of the present invention, a transistor with favorable electrical characteristics can be achieved.

Furthermore, the transistor 1810 includes an insulating layer 1728 over the electrode 1744*a*, the electrode 1744*b*, and the insulating layer 1741 and includes an insulating layer 1729 over the insulating layer 1728.

In the case where an oxide semiconductor is used for the semiconductor layer 1742, a material capable of removing oxygen from part of the semiconductor layer 1742 to generate oxygen vacancies is preferably used at least for portions of the electrode 1744*a* and the electrode 1744*b* that are in contact with the semiconductor layer 1742. The carrier concentration in regions of the semiconductor layer 1742 where oxygen vacancies are generated is increased, so that the regions become n-type regions (n$^+$ layers). Accordingly, the regions can function as a source region and a drain region. When an oxide semiconductor is used for the semiconductor layer 1742, examples of the material capable of removing oxygen from the semiconductor layer 1742 to generate oxygen vacancies include tungsten and titanium.

Formation of the source region and the drain region in the semiconductor layer 1742 makes it possible to reduce contact resistance between the semiconductor layer 1742 and each of the electrode 1744*a* and the electrode 1744*b*. Accordingly, the electrical characteristics of the transistor, such as the field-effect mobility and the threshold voltage, can be improved.

In the case where a semiconductor such as silicon is used for the semiconductor layer 1742, a layer that functions as an n-type semiconductor or a p-type semiconductor is preferably provided between the semiconductor layer 1742 and the electrode 1744*a* and between the semiconductor layer 1742 and the electrode 1744*b*. The layer that functions as an n-type semiconductor or a p-type semiconductor can function as a source region or a drain region of the transistor.

The insulating layer 1729 is preferably formed using a material that has a function of preventing or reducing diffusion of impurities into the transistor from the outside. Note that the insulating layer 1729 can be omitted as necessary.

A transistor 1811 illustrated in FIG. 12(A2) is different from the transistor 1810 in that an electrode 1723 that can function as a back gate electrode is provided over the insulating layer 1729. The electrode 1723 can be formed using a material and a method similar to those of the electrode 1746.

In general, a back gate electrode is formed using a conductive layer and positioned so that a channel formation region of a semiconductor layer is sandwiched between a gate electrode and the back gate electrode. Thus, the back gate electrode can function in a manner similar to that of the gate electrode. The potential of the back gate electrode may be set equal to the potential of the gate electrode, or may be a ground potential (GND potential) or a given potential. Moreover, by changing the potential of the back gate electrode not in synchronization with but independently of that of the gate electrode, the threshold voltage of the transistor can be changed.

In addition, the electrode 1746 and the electrode 1723 can each function as a gate electrode. Thus, the insulating layer 1726, the insulating layer 1728, and the insulating layer 1729 can each function as a gate insulating layer. Note that the electrode 1723 may be provided between the insulating layer 1728 and the insulating layer 1729.

Note that in the case where one of the electrode 1746 and the electrode 1723 is referred to as a "gate electrode," the other is referred to as a "back gate electrode." For example, in the case where the electrode 1723 in the transistor 1811 is referred to as a "gate electrode," the electrode 1746 is referred to as a "back gate electrode." In addition, in the case where the electrode 1723 is used as a "gate electrode," the transistor 1811 can be considered as a kind of top-gate transistor. Furthermore, in some cases, one of the electrode 1746 and the electrode 1723 is referred to as a "first gate electrode," and the other is referred to as a "second gate electrode."

By providing the electrode 1746 and the electrode 1723 with the semiconductor layer 1742 therebetween and setting the potential of the electrode 1746 equal to the potential of the electrode 1723, a region of the semiconductor layer 1742 through which carriers flow is enlarged in the film thickness direction; thus, the number of transferred carriers is increased. As a result, the on-state current of the transistor 1811 is increased and the field-effect mobility is increased.

Therefore, the transistor 1811 is a transistor having high on-state current for its occupation area. That is, the occupation area of the transistor 1811 can be small for required on-state current. According to one embodiment of the present invention, the occupation area of a transistor can be reduced. Therefore, according to one embodiment of the present invention, a semiconductor device having a high degree of integration can be achieved.

In addition, the gate electrode and the back gate electrode are formed using conductive layers and thus each have a function of preventing an electric field generated outside the transistor from influencing a semiconductor layer in which a channel is formed (in particular, an electric field blocking function against static electricity or the like). Note that when the back gate electrode is formed larger than the semiconductor layer such that the semiconductor layer is covered with the back gate electrode, the electric field blocking function can be enhanced.

Furthermore, when the back gate electrode is formed using a light-blocking conductive film, light can be prevented from entering the semiconductor layer from the back gate electrode side. Therefore, photodegradation of the semiconductor layer can be prevented and deterioration in electrical characteristics of the transistor, such as a shift of the threshold voltage, can be prevented.

According to one embodiment of the present invention, a transistor with high reliability can be achieved. Moreover, a semiconductor device with high reliability can be achieved.

FIG. 12(B1) is a cross-sectional view in the channel length direction of a channel-protective transistor 1820, which has a structure different from the structure in FIG. 12(A1). The transistor 1820 has substantially the same structure as the transistor 1810 but is different from the transistor 1810 in that the insulating layer 1741 covers end portions of the semiconductor layer 1742. In addition, the semiconductor layer 1742 is electrically connected to the electrode 1744a in an opening portion formed by selectively removing part of the insulating layer 1729 that overlaps with the semiconductor layer 1742. Furthermore, the semiconductor layer 1742 is electrically connected to the electrode 1744b in another opening portion formed by selectively removing part of the insulating layer 1729 that overlaps with the semiconductor layer 1742. A region of the insulating layer 1729 that overlaps with the channel formation region can function as a channel protective layer.

A transistor 1821 illustrated in FIG. 12(B2) is different from the transistor 1820 in that the electrode 1723 that can function as a back gate electrode is provided over the insulating layer 1729.

By providing the insulating layer 1741, the semiconductor layer 1742 can be prevented from being exposed at the time of forming the electrode 1744a and the electrode 1744b. Thus, the semiconductor layer 1742 can be prevented from being thinned down at the time of forming the electrode 1744a and the electrode 1744b.

In addition, the distance between the electrode 1744a and the electrode 1746 and the distance between the electrode 1744b and the electrode 1746 in the transistor 1820 and the transistor 1821 are larger than those in the transistor 1810 and the transistor 1811. Thus, parasitic capacitance generated between the electrode 1744a and the electrode 1746 can be reduced. Moreover, parasitic capacitance generated between the electrode 1744b and the electrode 1746 can be reduced. According to one embodiment of the present invention, a transistor with favorable electrical characteristics can be achieved.

FIG. 12(C1) is a cross-sectional view in the channel length direction of a channel-etched transistor 1825, which is a kind of bottom-gate transistor. In the transistor 1825, the electrode 1744a and the electrode 1744b are formed without using the insulating layer 1741. Thus, part of the semiconductor layer 1742 that is exposed at the time of forming the electrode 1744a and the electrode 1744b is etched in some cases. Meanwhile, since the insulating layer 1741 is not provided, the productivity of the transistor can be increased.

A transistor 1826 illustrated in FIG. 12(C2) is different from the transistor 1825 in that the electrode 1723 that can function as a back gate electrode is provided over insulating layer 1729.

FIG. 13(A1) to FIG. 13(C2) illustrate cross-sectional views in the channel width direction of the transistors 1810, 1811, 1820, 1821, 1825, and 1826, respectively.

In each of the structures illustrated in FIG. 13(B2) and FIG. 13(C2), the gate electrode is connected to the back gate electrode, and the gate electrode and the back gate electrode have the same potential. In addition, the semiconductor layer 1742 is sandwiched between the gate electrode and the back gate electrode.

The length in the channel width direction of each of the gate electrode and the back gate electrode is longer than the length in the channel width direction of the semiconductor layer 1742. In the channel width direction, the whole of the semiconductor layer 1742 is covered with the gate electrode or the back gate electrode with the insulating layers 1726, 1741, 1728, and 1729 sandwiched therebetween.

With the structure, the semiconductor layer 1742 included in the transistor can be surrounded by electric fields of the gate electrode and the back gate electrode.

A device structure of a transistor, like that of the transistor 1821 or the transistor 1826, in which electric fields of a gate electrode and a back gate electrode electrically surround the semiconductor layer 1742 where the channel formation region is formed can be referred to as a Surrounded channel (S-channel) structure.

With the S-channel structure, an electric field for inducing a channel can be effectively applied to the semiconductor layer 1742 by one or both of the gate electrode and the back gate electrode, which enables improvement in the current drive capability of the transistor and high on-state current characteristics. In addition, since the on-state current can be increased, it is possible to scale down the transistor. Furthermore, with the S-channel structure, the mechanical strength of the transistor can be increased.

<Top-Gate Transistor>

A transistor 1842 illustrated as an example in FIG. 14(A1) is a kind of top-gate transistor. The transistor 1842 is different from the transistor 1810 and the transistor 1820 in that the electrode 1744a and the electrode 1744b are formed after the insulating layer 1729 is formed. The electrode 1744a and the electrode 1744b are electrically connected to the semiconductor layer 1742 in opening portions formed in the insulating layer 1728 and the insulating layer 1729.

In addition, part of the insulating layer 1726 that does not overlap with the electrode 1746 is removed, and an impurity 755 is introduced into the semiconductor layer 1742 using the electrode 1746 and the remaining part of the insulating layer 1726 as a mask, so that an impurity region can be formed in the semiconductor layer 1742 in a self-aligned manner. The transistor 1842 includes a region where the insulating layer 1726 extends beyond end portions of the electrode 1746. The semiconductor layer 1742 in a region into which the impurity 755 is introduced through the insulating layer 1726 has a lower impurity concentration than a region into which the impurity 755 is introduced without through the insulating layer 1726. Thus, an LDD (Lightly Doped Drain) region is formed in a region of the semiconductor layer 1742 that does not overlap with the electrode 1746.

A transistor 1843 illustrated in FIG. 14(A2) is different from the transistor 1842 in that the electrode 1723 is included. The transistor 1843 includes the electrode 1723 formed over the substrate 1771. The electrode 1723 has a region overlapping with the semiconductor layer 1742 with the insulating layer 1772 therebetween. The electrode 1723 can function as a back gate electrode.

In addition, as in a transistor 1844 illustrated in FIG. 14(B1) and a transistor 1845 illustrated in FIG. 14(B2), the insulating layer 1726 in a region that does not overlap with the electrode 1746 may be completely removed. Furthermore, as in a transistor 1846 illustrated in FIG. 14(C1) and a transistor 1847 illustrated in FIG. 14(C2), the insulating layer 1726 may be left.

Also in the transistor 1842 to the transistor 1847, the impurity 755 is introduced into the semiconductor layer 1742 using the electrode 1746 as a mask after the formation of the electrode 1746, so that an impurity region can be formed in the semiconductor layer 1742 in a self-aligned manner. According to one embodiment of the present invention, a transistor with favorable electrical characteristics can be achieved. Furthermore, according to one embodiment of the present invention, a semiconductor device having a high degree of integration can be achieved.

FIG. 15(A1) to FIG. 15(C2) illustrate cross-sectional views in the channel width direction of the transistors 1842, 1843, 1844, 1845, 1846, and 1847, respectively.

The transistor 1843, the transistor 1845, and the transistor 1847 each have the above-described S-channel structure; however, one embodiment of the present invention is not limited to this, and the transistor 1843, the transistor 1845, and the transistor 1847 do not necessarily have the S-channel structure.

At least part of this embodiment can be implemented in combination with the other embodiments described in this specification as appropriate.

Embodiment 5

In this embodiment, structures of a data processing device of one embodiment of the present invention will be described with reference to FIG. 16 and FIG. 17.

Figures 17A, 17B, 17C, 17D, 17E:
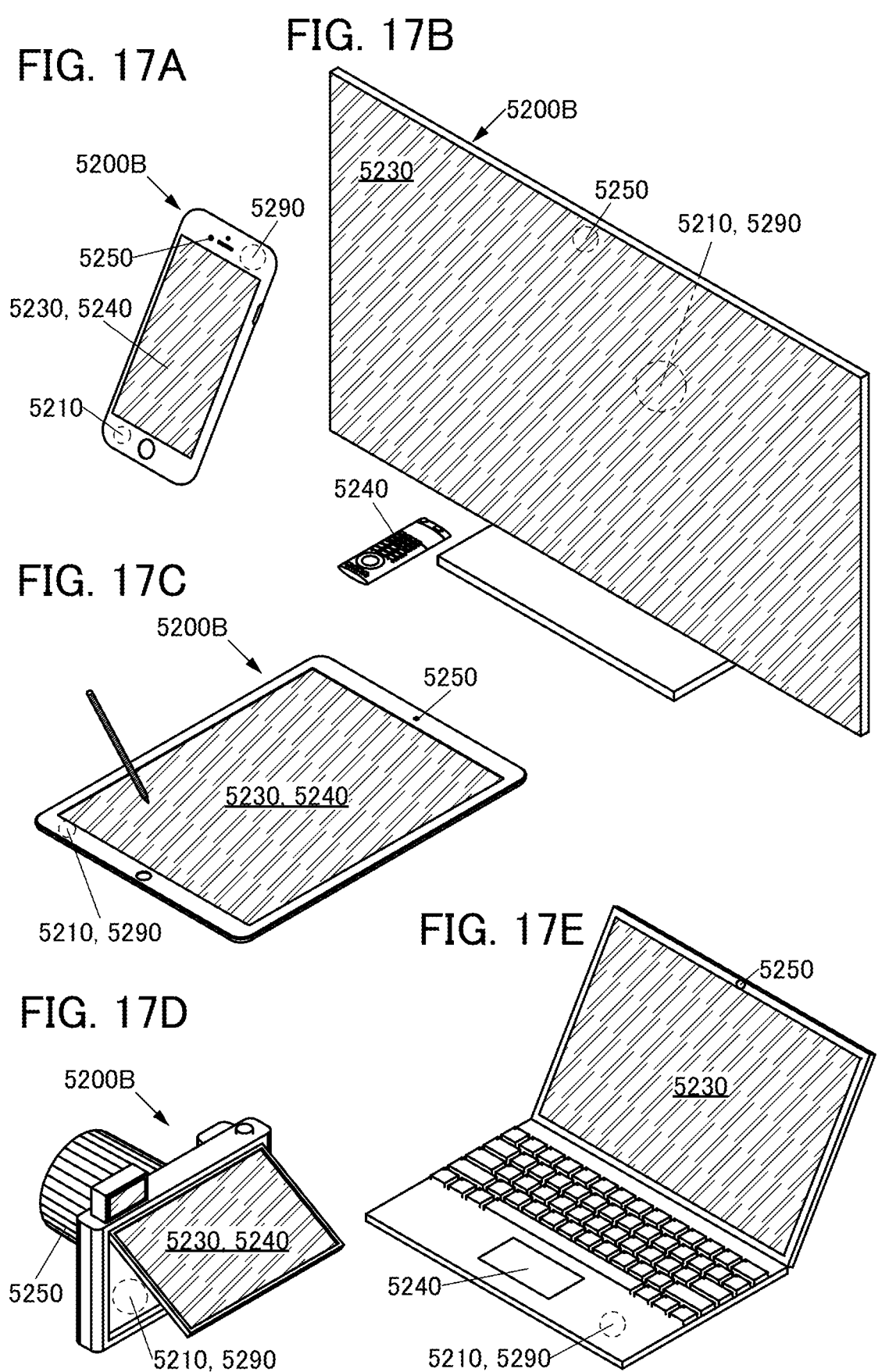
FIG. 17 (A) to (E)_Diagrams illustrating a data processing device.

FIG. 16 and FIG. 17 are diagrams showing structures of the data processing device of one embodiment of the present invention. FIG. 16(A) is a block diagram of the data processing device, and FIG. 16(B) to FIG. 16(E) are perspective views showing structures of the data processing device. In addition, FIG. 17(A) to FIG. 17(E) are perspective views showing structures of the data processing device.

<Data Processing Device>

A data processing device 5200B described in this embodiment includes an arithmetic device 5210 and an input/output device 5220 (see FIG. 16(A)).

The arithmetic device 5210 has a function of being supplied with operation data and a function of supplying image data on the basis of the operation data.

The input/output device 5220 includes a display portion 5230, an input portion 5240, a sensing portion 5250, and a communication portion 5290 and has a function of supplying operation data and a function of being supplied with image data. The input/output device 5220 also has a function of supplying sensing data, a function of supplying communication data, and a function of being supplied with communication data.

The input portion 5240 has a function of supplying operation data. For example, the input portion 5240 supplies operation data on the basis of operation by a user of the data processing device 5200B.

Specifically, a keyboard, a hardware button, a pointing device, a touch sensor, an illuminance sensor, an imaging device, an audio input device, an eye-gaze input device, an attitude detection device, or the like can be used as the input portion 5240.

The display portion 5230 includes a display panel and has a function of displaying image data. For example, the display device described in the above embodiment can be used for the display portion 5230.

The sensing portion 5250 has a function of supplying sensing data. For example, the sensing portion 5250 has a function of sensing a surrounding environment where the data processing device is used and supplying sensing data.

Specifically, an illuminance sensor, an imaging device, an attitude detection device, a pressure sensor, a human motion sensor, or the like can be used as the sensing portion 5250.

The communication portion 5290 has a function of being supplied with communication data and a function of supplying communication data. For example, the communication portion 5290 has a function of being connected to another electronic device or a communication network through wireless communication or wired communication. Specifically, the communication portion 5290 has a function of wireless local area network communication, telephone communication, near field communication, or the like.

Structure Example 1 of Data Processing Device

For example, the display portion 5230 can have an outer shape along a cylindrical column or the like (see FIG. 16(B)). In addition, the data processing device has a function of changing its display method in accordance with the illuminance of a usage environment. Furthermore, the data processing device has a function of changing displayed content in response to sensed existence of a person. This allows the data processing device to be provided on a column of a building, for example. Alternatively, the data processing device can display advertising, guidance, or the like. Alternatively, the data processing device can be used for digital signage or the like.

Structure Example 2 of Data Processing Device

For example, the data processing device has a function of generating image data on the basis of the path of a pointer used by a user (see FIG. 16(C)). Specifically, the display panel with a diagonal size of 20 inches or longer, preferably 40 inches or longer, further preferably 55 inches or longer can be used. Alternatively, a plurality of display panels can be arranged and used as one display region. Alternatively, a plurality of display panels can be arranged and used as a multiscreen. Thus, the data processing device can be used for an electronic blackboard, an electronic bulletin board, digital signage, or the like, for example.

Structure Example 3 of Data Processing Device

For example, the data processing device has a function of changing its display method in accordance with the illuminance of a usage environment (see FIG. 16(D)). Thus, for example, the power consumption of a smartwatch can be reduced. Alternatively, for example, a smartwatch can display an image to be suitably used even in an environment under strong external light, e.g., outdoors in fine weather.

Structure Example 4 of Data Processing Device

For example, the display portion 5230 has a surface gently curved along a side surface of a housing (see FIG. 16(E)). Alternatively, the display portion 5230 includes a display panel that can display an image on a front surface, side surfaces, and a top surface, for example. Thus, for example, a mobile phone can display image data not only on its front surface but also on its side surfaces and top surface.

Structure Example 5 of Data Processing Device

For example, the data processing device has a function of changing its display method in accordance with the illuminance of a usage environment (see FIG. 17(A)). Thus, the power consumption of a smartphone can be reduced. Alternatively, for example, a smartphone can display an image to be suitably used even in an environment under strong external light, e.g., outdoors in fine weather.

Structure Example 6 of Data Processing Device

For example, the data processing device has a function of changing its display method in accordance with the illuminance of a usage environment (see FIG. 17(B)). Accordingly, for example, a television system can display an image to be suitably used even when irradiated with strong external light that enters a room in fine weather.

Structure Example 7 of Data Processing Device

For example, the data processing device has a function of changing its display method in accordance with the illuminance of a usage environment (see FIG. 17(C)). Thus, for example, a tablet computer can display an image to be suitably used even in an environment under strong external light, e.g., outdoors in fine weather.

Structure Example 8 of Data Processing Device

For example, the data processing device has a function of changing its display method in accordance with the illuminance of a usage environment (see FIG. 17(D)). Accordingly, for example, a digital camera can display a subject in such a manner that an image is favorably viewed even in an environment under strong external light, e.g., outdoors in fine weather.

Structure Example 9 of Data Processing Device

For example, the data processing device has a function of changing its display method in accordance with the illuminance of a usage environment (see FIG. 17(E)). Accordingly, for example, a personal computer can display an image to be suitably used even in an environment under strong external light, e.g., outdoors in fine weather.

At least part of this embodiment can be implemented in combination with the other embodiments described in this specification as appropriate.

Embodiment 6

In this embodiment, a metal oxide that can be favorably used for a channel formation region of a transistor will be described.

As a semiconductor material used for a transistor, a metal oxide whose energy gap is greater than or equal to 2 eV, preferably greater than or equal to 2.5 eV, further preferably greater than or equal to 3 eV can be used. A typical example is a metal oxide containing indium, and a CAC-OS described later or the like can be used, for example.

A transistor with a metal oxide having a larger band gap and a lower carrier density than silicon has low off-state current; therefore, charges accumulated in a capacitor that is series-connected to the transistor can be held for a long time.

A semiconductor layer can be, for example, a film represented by an In-M-Zn-based oxide that contains indium, zinc, and M (a metal such as aluminum, titanium, gallium, germanium, yttrium, zirconium, lanthanum, cerium, tin, neodymium, or hafnium).

In the case where a metal oxide that constitutes the semiconductor layer is an In-M-Zn-based oxide, it is preferable that the atomic ratio of metal elements in a sputtering target used to deposit an In-M-Zn oxide satisfy In≥M and Zn≥M. The atomic ratio of metal elements of such a sputtering target is preferably In:M:Zn=1:1:1, In:M:Zn=1:1:1.2, In:M:Zn=3:1:2, In:M:Zn=4:2:3, In:M:Zn=4:2:4.1, In:M:Zn=5:1:6, In:M:Zn=5:1:7, In:M:Zn=5:1:8, or the like. Note that the atomic ratio in the deposited semiconductor layer varies from the atomic ratio of metal elements in the sputtering targets in a range of ±40%.

A metal oxide film with a low carrier density is used for the semiconductor layer. For example, for the semiconductor layer, a metal oxide whose carrier density is lower than or equal to $1 \times 10^{17}/cm^3$, preferably lower than or equal to $1 \times 10^{15}/cm^3$, further preferably lower than or equal to $1 \times 10^{13}/cm^3$, still further preferably lower than or equal to $1 \times 10^{11}/cm^3$, even further preferably lower than $1 \times 10^{10}/cm^3$, and higher than or equal to $1 \times 10^{-9}/cm^3$ can be used. Such a metal oxide is referred to as a highly purified intrinsic or substantially highly purified intrinsic metal oxide. The oxide semiconductor has a low density of defect states and can be regarded as a metal oxide having stable characteristics.

Note that the composition is not limited to those, and an oxide semiconductor having appropriate composition may be used depending on required semiconductor characteristics and electrical characteristics of the transistor (field-effect mobility, threshold voltage, or the like). In addition, to obtain the required semiconductor characteristics of the transistor, it is preferable that the carrier density, impurity concentration, defect density, atomic ratio between a metal element and oxygen, interatomic distance, density, and the like of the semiconductor layer be set to be appropriate.

When silicon or carbon, which is one of the Group 14 elements, is contained in the metal oxide that constitutes the semiconductor layer, oxygen vacancies in the semiconductor layer are increased, and the semiconductor layer becomes n-type. Thus, the concentration (concentration obtained by secondary ion mass spectrometry) of silicon or carbon in the semiconductor layer is set to lower than or equal to $2 \times 10^{18}$ atoms/cm³, preferably lower than or equal to $2 \times 10^{17}$ atoms/cm³.

In addition, alkali metal and alkaline earth metal might generate carriers when bonded to a metal oxide, in which case the off-state current of the transistor might be increased. Thus, the concentration obtained by secondary ion mass spectrometry of alkali metal or alkaline earth metal in the semiconductor layer is set to lower than or equal to $1 \times 10^{18}$ atoms/cm³, preferably lower than or equal to $2 \times 10^{16}$ atoms/cm³.

Furthermore, when nitrogen is contained in the metal oxide that constitutes the semiconductor layer, electrons serving as carriers are generated and the carrier density is increased, so that the semiconductor layer easily becomes n-type. As a result, a transistor using a metal oxide that contains nitrogen is likely to have normally-on characteristics. Therefore, the concentration obtained by secondary ion mass spectrometry of nitrogen in the semiconductor layer is preferably set to lower than or equal to $5 \times 10^{18}$ atoms/cm³.

Oxide semiconductors are classified into a single crystal oxide semiconductor and a non-single-crystal oxide semiconductor. Examples of a non-single-crystal oxide semiconductor include a CAAC-OS (c-axis aligned crystalline oxide semiconductor), a polycrystalline oxide semiconductor, an nc-OS (nanocrystalline oxide semiconductor), an amorphous-like oxide semiconductor (a-like OS), and an amorphous oxide semiconductor.

In addition, a CAC-OS (Cloud-Aligned Composite oxide semiconductor) may be used for a semiconductor layer of a transistor disclosed in one embodiment of the present invention.

Note that the non-single-crystal oxide semiconductor or CAC-OS can be suitably used for a semiconductor layer of a transistor disclosed in one embodiment of the present invention. In addition, as the non-single-crystal oxide semiconductor, the nc-OS or the CAAC-OS can be suitably used.

Note that in one embodiment of the present invention, a CAC-OS is preferably used for a semiconductor layer of a transistor. The use of the CAC-OS allows the transistor to have high electrical characteristics or high reliability.

Note that the semiconductor layer may be a mixed film including two or more kinds of a region of a CAAC-OS, a region of a polycrystalline oxide semiconductor, a region of an nc-OS, a region of an amorphous-like oxide semiconductor, and a region of an amorphous oxide semiconductor. The mixed film has, for example, a single-layer structure or a stacked-layer structure including two or more kinds of the above regions in some cases.

The composition of a CAC (Cloud-Aligned Composite)-OS that can be used in a transistor disclosed in one embodiment of the present invention is described below.

The CAC-OS is, for example, a composition of a material in which elements that constitute a metal oxide are unevenly distributed to have a size of greater than or equal to 0.5 nm and less than or equal to 10 nm, preferably greater than or equal to 1 nm and less than or equal to 2 nm, or a similar size. Note that in the following description, a state in which one or more metal elements are unevenly distributed and regions including the metal element(s) are mixed to have a size of greater than or equal to 0.5 nm and less than or equal to 10 nm, preferably greater than or equal to 1 nm and less than or equal to 2 nm, or a similar size in a metal oxide is referred to as a mosaic pattern or a patch-like pattern.

Note that the metal oxide preferably contains at least indium. In particular, indium and zinc are preferably contained. Moreover, in addition to these, one kind or a plurality of kinds selected from aluminum, gallium, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like may be contained.

For example, a CAC-OS in an In—Ga—Zn oxide (an In—Ga—Zn oxide in the CAC-OS may be particularly referred to as CAC-IGZO) has a composition in which materials are separated into indium oxide (hereinafter referred to as $InO_{X1}$ (X1 is a real number greater than 0)) or indium zinc oxide (hereinafter referred to as $In_{X2}Zn_{Y2}O_{Z2}$ (each of X2, Y2, and Z2 is a real number greater than 0)) and gallium oxide (hereinafter referred to as $GaO_{X3}$ (X3 is a real number greater than 0)), gallium zinc oxide (hereinafter referred to as $Ga_{X4}Zn_{Y4}O_{Z4}$ (each of X4, Y4, and Z4 is a real number greater than 0)), or the like so that a mosaic pattern is formed, and mosaic-like $InO_{X1}$ or $In_{X2}Zn_{Y2}O_{Z2}$ is evenly distributed in the film (this composition is hereinafter also referred to as a cloud-like composition).

That is, the CAC-OS is a composite metal oxide having a composition in which a region where $GaO_{X3}$ is a main component and a region where $In_{X2}Zn_{Y2}O_{Z2}$ or $InO_{X1}$ is a main component are mixed. Note that in this specification, for example, when the atomic ratio of In to an element M in a first region is larger than the atomic ratio of In to the element M in a second region, the first region is regarded as having a higher In concentration than the second region.

Note that IGZO is a commonly known name and sometimes refers to one compound formed of In, Ga, Zn, and O. A typical example is a crystalline compound represented by $InGaO_3(ZnO)_{m1}$ (m1 is a natural number) or $In_{(1+x0)}Ga_{(1-x0)}O_3(ZnO)_{m0}$ ($-1 \leq x0 \leq 1$; m0 is a given number).

The crystalline compound has a single crystal structure, a polycrystalline structure, or a CAAC structure. Note that the CAAC structure is a crystal structure in which a plurality of IGZO nanocrystals have c-axis alignment and are connected in an a-b plane without alignment.

Meanwhile, the CAC-OS relates to the material composition of a metal oxide. In the material composition of a CAC-OS containing In, Ga, Zn, and O, some regions that contain Ga as a main component and are observed as nanoparticles and some regions that contain In as a main component and are observed as nanoparticles are each randomly dispersed in a mosaic pattern. Therefore, the crystal structure is a secondary element for the CAC-OS.

Note that the CAC-OS is regarded as not including a stacked-layer structure of two or more kinds of films with different compositions. For example, a two-layer structure of a film containing In as a main component and a film containing Ga as a main component is not included.

Note that a clear boundary between the region where $GaO_{X3}$ is a main component and the region where $In_{x2}Zn_{Y2}O_{Z2}$ or $InO_{X1}$ is a main component cannot be observed in some cases.

Note that in the case where one kind or a plurality of kinds selected from aluminum, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like are contained instead of gallium, the CAC-OS refers to a composition in which some regions that contain the metal element(s) as a main component and are observed as nanoparticles and some regions that contain In as a main component and are observed as nanoparticles are each randomly dispersed in a mosaic pattern.

The CAC-OS can be formed by a sputtering method under a condition where a substrate is not heated, for example. In addition, in the case of forming the CAC-OS by a sputtering method, one or more selected from an inert gas (typically, argon), an oxygen gas, and a nitrogen gas may be used as a deposition gas. Furthermore, the ratio of the flow rate of an oxygen gas to the total flow rate of the deposition gas at the time of deposition is preferably as low as possible, and for example, the ratio of the flow rate of the oxygen gas is preferably higher than or equal to 0% and lower than 30%, further preferably higher than or equal to 0% and lower than or equal to 10%.

The CAC-OS is characterized in that no clear peak is observed at the time of measurement using θ/2θ scan by an Out-of-plane method, which is one of the X-ray diffraction (XRD) measurement methods. That is, it is found from X-ray diffraction measurement that no alignment in an a-b plane direction and a c-axis direction is observed in a measured region.

In addition, in an electron diffraction pattern of the CAC-OS that is obtained by irradiation with an electron beam with a probe diameter of 1 nm (also referred to as a nanobeam electron beam), a ring-like high-luminance region and a plurality of bright spots in the ring region are observed. It is therefore found from the electron diffraction pattern that the crystal structure of the CAC-OS includes an nc (nanocrystal) structure with no alignment in a plan-view direction and a cross-sectional direction.

Moreover, for example, it can be confirmed by EDX mapping obtained using energy dispersive X-ray spectroscopy (EDX) that the CAC-OS in the In—Ga—Zn oxide has a composition in which regions where $GaO_{X3}$ is a main component and regions where $In_{x2}Zn_{Y2}O_{Z2}$ or $InO_{X1}$ is a main component are unevenly distributed and mixed.

The CAC-OS has a composition different from that of an IGZO compound in which metal elements are evenly distributed, and has characteristics different from those of the IGZO compound. That is, the CAC-OS has a composition in which regions where $GaO_{X3}$ or the like is a main component and regions where $In_{x2}Zn_{Y2}O_{Z2}$ or $InO_{X1}$ is a main component are phase-separated from each other, and the regions including the respective elements as the main components form a mosaic pattern.

Here, a region where $In_{x2}Zn_{Y2}O_{Z2}$ or $InO_{X1}$ is a main component is a region whose conductivity is higher than that of a region where $GaO_{X3}$ or the like is a main component. In other words, when carriers flow through regions where $In_{x2}Zn_{Y2}O_{Z2}$ or $InO_{X1}$ is a main component, the conductivity of a metal oxide is exhibited. Accordingly, when the regions where $In_{x2}Zn_{Y2}O_{Z2}$ or $InO_{X1}$ is a main component are distributed like a cloud in a metal oxide, high field-effect mobility (μ) can be achieved.

In contrast, a region where $GaO_{X3}$ or the like is a main component is a region whose insulating property is higher than that of a region where $In_{x2}Zn_{Y2}O_{Z2}$ or $InO_{X1}$ is a main component. In other words, when regions where $GaO_{X3}$ or the like is a main component are distributed in a metal oxide, leakage current can be suppressed and favorable switching operation can be achieved.

Accordingly, when the CAC-OS is used for a semiconductor element, the insulating property derived from $GaO_{X3}$ or the like and the conductivity derived from $In_{x2}Zn_{Y2}O_{Z2}$ or $InO_{X1}$ complement each other, so that high on-state current ($I_{on}$) and high field-effect mobility (μ) can be achieved.

In addition, a semiconductor element using the CAC-OS has high reliability. Thus, the CAC-OS is suitable for a variety of semiconductor devices typified by a display.

In addition, since a transistor including the CAC-OS in a semiconductor layer has high field-effect mobility and high drive capability, the use of the transistor in a driver circuit, a typical example of which is a scan line driver circuit that generates a gate signal, can provide a display device with a narrow bezel width (also referred to as a narrow bezel). Furthermore, with the use of the transistor in a signal line driver circuit that is included in a display device (particularly in a demultiplexer connected to an output terminal of a shift register included in a signal line driver circuit), a display device to which a small number of wirings are connected can be provided.

Furthermore, the transistor including the CAC-OS in the semiconductor layer does not need a laser crystallization step like a transistor including low-temperature polysilicon. Thus, the manufacturing cost of a display device can be reduced even when the display device is formed using a large area substrate. In addition, the transistor including the CAC-OS in the semiconductor layer is preferably used for a driver circuit and a display portion in a large display device having high resolution such as ultra-high definition ("4K resolution," "4K2K," and "4K") or super high definition ("8K resolution," "8K4K," and "8K") because writing can be performed in a short time and display defects can be reduced.

Alternatively, silicon may be used for a semiconductor in which a channel of a transistor is formed. Although amorphous silicon may be used as silicon, silicon having crystallinity is particularly preferably used. For example, micro-crystalline silicon, polycrystalline silicon, single crystal silicon, or the like is preferably used. In particular, polycrystalline silicon can be formed at a temperature lower than that for single crystal silicon and has higher field-effect mobility and higher reliability than amorphous silicon.

At least part of this embodiment can be implemented in combination with the other embodiments described in this specification as appropriate.

REFERENCE NUMERALS

G1: wiring, G2: wiring, G3: wiring, G3A: wiring, S1: wiring, V0: wiring, 10: pixel, 10A: pixel, 11: transistor, 12: transistor, 13: transistor, 14: transistor, 15: capacitor, 16: capacitor, 17: light-emitting element, 20: display device, 20A: display device, 20B: display device, 20C: display device, 21: display region, 22: source driver, 23: gate driver, 23a: gate driver, 23b: gate driver, 23c: gate driver, 23d: gate driver, 24: triangle wave generation circuit, 31: transistor, 32: transistor, 33: transistor, 34: capacitor, 35: light-emitting element, 301: conductive layer, 303: conductive layer, 305: conductive layer, 311: insulating layer, 321: semiconductor layer, 323: semiconductor layer, 325: semiconductor layer, 331: insulating layer, 333: insulating layer, 341: conductive layer, 343: conductive layer, 351: conductive layer, 353: conductive layer, 361: insulating layer, 363: insulating layer, 371: conductive layer, 373a: conductive layer, 373b: conductive layer, 375: conductive layer, 377: conductive layer, 379: insulating layer, 700: display device, 700A: display device, 700B: display device, 701: substrate, 702: pixel portion, 704: source driver circuit portion, 705: substrate, 706: gate driver circuit portion, 708: FPC terminal portion, 710: signal line, 711: wiring portion, 712: sealant, 716: FPC, 717: IC, 721: source driver IC, 722: gate driver circuit portion, 723: FPC, 724: printed circuit board, 730: insulating film, 732: sealing film, 743: resin layer, 750: transistor, 752: transistor, 760: wiring, 770: insulating layer, 772: conductive layer, 774: conductive layer, 780: anisotropic conductive film, 782: light-emitting element, 790: capacitor, 791: bump, 793: bump, 795: light-blocking layer, 1723: electrode, 1724a: electrode, 1724b: electrode, 1726: insulating layer, 1727: insulating layer, 1728: insulating layer, 1729: insulating layer, 1741: insulating layer, 1742: semiconductor layer, 1744a: electrode, 1744b: electrode, 1746: electrode, 1771: substrate, and 1772: insulating layer.

The invention claimed is:

1. A method for driving a display device,
the display device comprising:
a plurality of pixels, each of the plurality of pixels comprising:
a light-emitting element;
a first transistor;
a second transistor;
a third transistor; and
a first capacitor;
a first wiring;
a second wiring; and
a third wiring,
wherein the first wiring is electrically connected to one electrode of the light-emitting element,
wherein one of a source and a drain of the first transistor is electrically connected to the other electrode of the light-emitting element, wherein one of a source and a drain of the third transistor is electrically connected to the second wiring, wherein the other of the source and the drain of the third transistor is directly connected to each of a gate of the first transistor, one of a source and a drain of the second transistor, and one electrode of the first capacitor,
wherein a gate of the second transistor is electrically connected to the third wiring,
wherein an amount of current that can flow through the first transistor is determined in accordance with a potential of display data input to the second wiring,
wherein a triangle wave is input to the first wiring,
wherein emission luminance of the light-emitting element is controlled in accordance with a potential of the triangle wave,
wherein the second transistor is set in an on state and the first transistor is set in an off state by input of a reset signal to the third wiring,
wherein the potential of the triangle wave becomes the lowest in synchronization with the reset signal, and
wherein the light-emitting element is turned off.

2. A display device comprising:
a plurality of pixels, each of the plurality of pixels comprising:
a light-emitting element;
a first transistor;
a second transistor;
a third transistor; and
a first capacitor;
a first wiring;
a second wiring;
a third wiring;
a fourth wiring; and
a fifth wiring,
wherein a triangle wave is input to the first wiring,
wherein a scan signal is input to the second wiring,
wherein a reset signal is input to the third wiring,
wherein display data is input to the fourth wiring,
wherein a low potential lower than a potential of the display data is applied to the fifth wiring,
wherein a gate of the third transistor is electrically connected to the second wiring,
wherein one of a source and a drain of the third transistor is electrically connected to the fourth wiring,
wherein the other of the source and the drain of the third transistor is directly connected to each of a gate of the first transistor, one of a source and a drain of the second transistor, and one electrode of the first capacitor,
wherein a gate of the second transistor is electrically connected to the third wiring,
wherein the other of the source and the drain of the second transistor is electrically connected to the fifth wiring,
wherein one of a source and a drain of the first transistor is electrically connected to one electrode of the light-emitting element, and
wherein the other electrode of the light-emitting element is electrically connected to the first wiring.

3. The method for driving the display device according to claim 1, wherein the light-emitting element is an organic light-emitting diode.

4. The method for driving the display device according to claim 1, wherein at least one of the first transistor, the second transistor, and the third transistor includes a metal oxide in a semiconductor layer.

5. The display device according to claim 2, wherein the light-emitting element is an organic light-emitting diode.

6. The display device according to claim 2, wherein at least one of the first transistor, the second transistor, and the third transistor includes a metal oxide in a semiconductor layer.

* * * * *